US012653016B2

(12) United States Patent
Chiu et al.

(10) Patent No.: US 12,653,016 B2
(45) Date of Patent: Jun. 9, 2026

(54) METHODS OF FORMING METAL ION BARRIER LAYERS AND RESULTING STRUCTURES

(71) Applicant: Taiwan Semiconductor Manufacturing Co., Ltd., Hsinchu (TW)

(72) Inventors: Chih-Pin Chiu, Hsinchu (TW); Yu-Bey Wu, Hsinchu (TW); Dian-Hau Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 496 days.

(21) Appl. No.: 18/448,407

(22) Filed: Aug. 11, 2023

(65) Prior Publication Data

US 2024/0355766 A1      Oct. 24, 2024

Related U.S. Application Data

(60) Provisional application No. 63/497,770, filed on Apr. 24, 2023.

(51) Int. Cl.
*H01L 23/02* (2006.01)
*H01L 23/00* (2006.01)
*H01L 23/485* (2006.01)

(52) U.S. Cl.
CPC ............ *H01L 24/06* (2013.01); *H01L 23/485* (2013.01); *H01L 24/03* (2013.01); *H01L 2224/03005* (2013.01); *H01L 2224/06102* (2013.01)

(58) Field of Classification Search
CPC ....... H01L 24/06; H01L 23/485; H01L 24/03; H01L 2224/03005; H01L 2224/06102; H01L 25/0657; H01L 2224/16145; H01L 2224/32145; H01L 2225/06541; H01L 24/08; H01L 24/05; H01L 2224/08145; H01L 2224/80896; H01L 2224/80895; H01L 2224/16225; H01L 2224/83894; H01L 24/73; H01L 2224/16146; H01L 23/5226; H01L 23/528; H01L 2224/0603; H01L 2224/04042; H01L 2224/80001;
(Continued)

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |

(Continued)

FOREIGN PATENT DOCUMENTS

| | | | |
|---|---|---|---|
| KR | 20050032665 A | 4/2005 | |
| TW | I538100 B | 6/2016 | |

(Continued)

*Primary Examiner* — Niki H Nguyen
(74) *Attorney, Agent, or Firm* — Slater Matsil, LLP

(57) ABSTRACT

A first bond pad of a first device and a second bond pad of a second device are implanted with metal ions. The first and second semiconductor device are bonded together using a direct metal-to-metal bond and an overlay offset occurs between the bond pads such that a portion of the first bond pad and a portion of the second bond pad overlaps and contacts a dielectric material layer. During the bonding process, however, diffusion of the metal ions provides a barrier layer at the interface of the bond pads and the dielectric layers.

20 Claims, 19 Drawing Sheets

(58) Field of Classification Search
CPC ....... H01L 2224/80357; H01L 23/5386; H01L 24/09; H01L 25/167; H01L 2224/06051; H01L 2224/0401; H01L 23/5384; H01L 25/0652; H01L 2224/08146; H01L 25/072; H01L 2224/48137; H01L 2224/49111; H01L 2225/06565; H01L 2224/09517; H01L 2224/04105; H01L 2224/48453; H01L 2224/04026; H01L 2224/05548; H01L 2224/81205; H01L 2224/81801; H01L 2224/838; H01L 23/49827; H01L 25/105; H01L 21/486; H01L 21/4853; H01L 21/67144; H01L 2224/8034; H01L 2224/48145; H01L 2224/06165; H01L 21/187; H01L 25/0756; H01L 2224/40145; H01L 2224/48472; H01L 2224/75745; H01L 21/76251; H01L 2224/06505; H01L 2224/0558; H01L 2224/023; H01L 24/02
See application file for complete search history.

(56) References Cited

U.S. PATENT DOCUMENTS

| | | | |
|---|---|---|---|
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 9,941,243 B2 * | 4/2018 | Kim | H01L 24/03 |
| 10,340,450 B2 | 7/2019 | Hsu et al. | |
| 2014/0252619 A1 | 9/2014 | Lin et al. | |
| 2015/0053908 A1 | 2/2015 | Fowler | |
| 2015/0108648 A1 * | 4/2015 | Tsumura | H01L 24/05 |
| | | | 438/107 |
| 2016/0225694 A1 | 8/2016 | Barth et al. | |
| 2020/0052203 A1 | 2/2020 | Trinh et al. | |
| 2020/0235063 A1 * | 7/2020 | Chen | H01L 25/50 |
| 2021/0028136 A1 | 1/2021 | Said et al. | |

FOREIGN PATENT DOCUMENTS

| | | |
|---|---|---|
| TW | I552291 B | 10/2016 |
| TW | I610476 B | 1/2018 |

* cited by examiner

100

200

205

209tv

210

210

202

209d

203

213
209
211
207
209
207
211
201

Z
Y
X

METHODS OF FORMING METAL ION BARRIER LAYERS AND RESULTING STRUCTURES

PRIORITY CLAIM AND CROSS-REFERENCE

This application claims the benefit of U.S. Provisional Application No. 63/497,770, filed on Apr. 24, 2023, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (POP) technology. In a POP device, a top semiconductor package is stacked on top of a bottom semiconductor package to provide a high level of integration and component density. PoP technology generally enables production of semiconductor devices with enhanced functionalities and small footprints on a printed circuit board (PCB).

Stacked semiconductor devices have emerged as an effective technique for further reducing the physical size of a semiconductor device. In a stacked semiconductor device, active circuits such as logic and memory circuits are fabricated on different semiconductor wafers. Two or more semiconductor wafers may be bonded together through suitable bonding techniques to further reduce the form factor of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
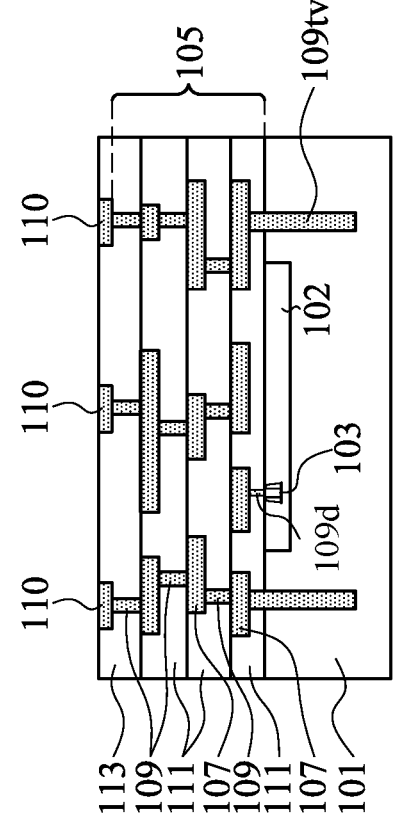
FIG. 1 illustrates a cross-sectional view of a first semiconductor device at intermediate stages of manufacture, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Solder free bonds between two devices may be used to bond together metal pads in a direct metal-to-metal bond by aligning bond pads, pressing the pads together, and applying a thermal process to cause metal from one bond pad to interdiffuse with metal from the other bond pad and vise versa. In the same process, a dielectric layer surrounding the bond pads may also fuse together by forming cross-linked bonds between the respective dielectric layers. Because both a metal-to-metal bond and a dielectric-to-dielectric bond result from this process, the bond process is sometimes referred to as a hybrid bond.

As bond pads get smaller and spaced at a finer pitch, misalignment between the pads can cause a portion of the bond pad of one device to rest on the dielectric layer of the other device, and vise versa. If the bond pad is made of a metal with a high diffusion property, such as copper, and the dielectric material of the dielectric layer is susceptible to diffusion, such as silicon oxide, then diffusion of the contact pad into the dielectric layer can occur. Unwanted behavior can occur from such diffusion, such as for example, dielectric breakdown. One such dielectric breakdown is known as time dependent dielectric breakdown (TDDB). This may occur when current leakage or voltage differentials eventually cause enough stress for the dielectric material to fail and a permanent conductive path to emerge through the dielectric layer. Metal diffusion is one cause of such failures. Typically, to prevent or reduce diffusion, conductive elements are lined with a barrier liner, where the barrier liner reduces diffusion. However, because of the nature of the solderless metal-to-metal bond, the overlay misalignment can cause the metal to rest directly on the dielectric layer so that diffusion can occur.

Embodiments provide a solution to this problem by utilizing a metal ion implantation or doping of one or more of the bond pads. Then, when the metal-to-metal bond is made, the metal ions diffuse to the bottom surfaces, side surfaces, and interfaces of the bond pads, thereby forming a second diffusion barrier on the first diffusion barrier, where the second diffusion barrier is included at the interface of the bond pad and the dielectric layer. As a result, diffusion of the bond pad material into the dielectric layer can be prevented or reduced. Accordingly, device reliability is improved.

FIG. 1 illustrates a side view of a first exemplary semiconductor device 100, which includes a substrate 101. For clarity, only a small portion of substrate 101, is shown. The first semiconductor device 100 may be a die or a package component in some embodiments. The substrate 101 may be a bulk silicon substrate although other semiconductor materials including group III, group IV, and group V elements may also be used. Active devices 103, such as transistors, may be formed in and/or on the substrate 101, for example, in a device region 102.

The interconnect structure 105 is formed over the substrate 101. In some embodiments, the interconnect structure 105 may include at least one dielectric layer 111, such as a dielectric layer 111 formed of silicon oxides, silicon oxynitrides, silicon carbides, low-k dielectric materials having k values, for example, lower than about 4.0, and the like. In some embodiments, the dielectric layer 111 may be made of, for example, silicon oxide, SiCOH, and the like. The interconnect structure 105 includes metal lines 107 for interconnecting various active devices 103 and further include vias 109 (including the device vias 109d) for interconnecting metal lines that are located in different layers of interconnect structure 105, which are formed in the respective dielectric layers 111. As used herein, and consistent with common usage in the art, the term lines will be used to refer to conductive structures that reside within one layer of interconnect structure 105 and generally run in a an X or Y direction, i.e. parallel to the major surface of substrate 101, and the term vias will be used to refer to a conductive structure that extends between and electrically interconnects different layers of lines within interconnect structure, generally running in the Z direction, or perpendicular to the major surface of substrate 101. While only 3 layers of lines is illustrated in exemplary interconnect structure 105 of FIG. 1, one skilled in the art will recognize that many such layers, perhaps eight or more, could be employed in a practical application.

The metal lines 107 and vias 109 may be formed of copper or copper alloys, although they can also be formed of other metals. The metal lines 107 and vias 109 may be formed by etching openings in the dielectric layers, filling the openings with a conductive material, and performing a planarization (such as a chemical mechanical polishing, or CMP) to level top surfaces of the metal lines 107 and vias 109 with top surfaces of the dielectric layers. Typically, a metal line 107 and an underlying via 109 are using a dual damascene process in which the relevant dielectric layer 111 is first patterned to have an opening corresponding to metal line 107 and then patterned a second time to have an opening corresponding to via 109, after which the openings are filled with, e.g., copper (a so-called trench-first dual damascene process), or else the relevant dielectric layer 111 is first patterned to have an opening corresponding to via 109 and then patterned a second time to have an opening corresponding to metal line 107 after which both openings are filled with, e.g., copper (a so-called via-first dual damascene process). Other patterning processes and/or deposition techniques may be used to form the metal lines 107 and vias 109.

As FIG. 1 further illustrates, interconnect structure 105 includes a topmost layer that includes metal lines 107 in the topmost layer and further includes bond pads 110 also formed within, or at least partially within topmost dielectric layer 113. As shown, topmost vias 109 formed within topmost dielectric layer 113 electrically connect topmost metal lines 107 to respective bond pads 110. As above, topmost metal lines 107 and topmost vias 109 may be formed using a trench-first or a via-first dual damascene process.

As FIG. 1 further illustrates, interconnect structure 105 may also include a through-die via 109tv extending from the bottommost layer of the interconnect structure 105 down into the substrate 101. The through-die via 109tv may be exposed in a subsequent process by thinning the substrate 101 from a back side of the device or wafer. The through-die via 109tv may be formed using the same processes as the vias 109.

Although not limiting, bond pads 110 may be formed of the same or similar material as metal lines 107, such as copper or a copper alloy (or other metals such as, by way of example, and not by way of exhaustion or limitation, other metals could include molybdenum, manganese, titanium, tungsten, aluminum, cobalt, and alloys of same). In some embodiments, bond pads 110 can be formed also using a damascene process to pattern and etch openings in the topmost dielectric layer 113 corresponding to the bond pads 110 and pattern and etch openings in the topmost dielectric layer 113 within the bond pad openings which correspond to the topmost vias 109. In some embodiments, however, the bond pad openings may expose an upper surface of the topmost vias 109 which are already formed.

A conductive diffusion barrier (see FIG. 7, 112) may be formed first. In accordance with some embodiments of the present disclosure, the conductive diffusion barrier may be formed of titanium, titanium nitride, tantalum, tantalum nitride, or the like. The conductive diffusion barrier may be formed, for example, using Atomic Layer Deposition (ALD), Physical Vapor Deposition (PVD), or the like. The conductive diffusion barrier may include a layer in the openings for the topmost vias 109 and the bond pads 110 and a layer extending over the upper surface of the topmost dielectric layer 113.

Next, a metallic material is deposited to form the bond pads 110 and the vias 109, for example, through Electro-Chemical Plating (ECP) or another suitable deposition process. The metallic material is deposited on the conductive diffusion barrier and fills the remaining openings for the bond pads 110 and the vias 109. The metallic material may also extend over the top surface of the dielectric layer 113. The metallic material may include copper or copper alloy. In such embodiments, the bond pads 110 and topmost vias 109 may be formed simultaneously. In other embodiments, the topmost vias 109 may be formed in a dielectric layer 111 and the topmost dielectric layer 113 overlies that layer and includes the bond pads 110, which are formed in separate processes than the topmost vias 109. In some embodiments, a separate seed layer may be deposited over the diffusion barrier, such as a copper alloy seed layer.

A planarization process such as a Chemical Mechanical Polish (CMP) process may then be performed to remove excess portions of the metallic material and the diffusion barrier, until dielectric layer 113 is exposed. The remaining portions of the diffusion barrier and metallic material include bond pads 110 and vias 109.

Other processes may be used to form the bond pads 110 and vias 109. Regardless of the process by which bond pads 110 are formed, it is desirable in most embodiments that bond pads 110 have respective top surfaces that are substantially planar with the top surface of the topmost dielectric layer 113 as the topmost surfaces will serve as bonding surfaces during a wafer-to-wafer bonding process that will be further described in subsequent paragraphs. In some embodiments, however, some or all of the respective topmost surfaces of bond pads 110 may be slightly below the top surface of the topmost dielectric layer 113, provided that the distance between the respective top surfaces of bond pads 110 and the top surface of the topmost dielectric layer 113 is sufficiently small that the gap can be filled either by thermal expansion of the respective bond pads 110, mechanical deformation of the topmost dielectric layer, or a combination of both.

Figure 2:
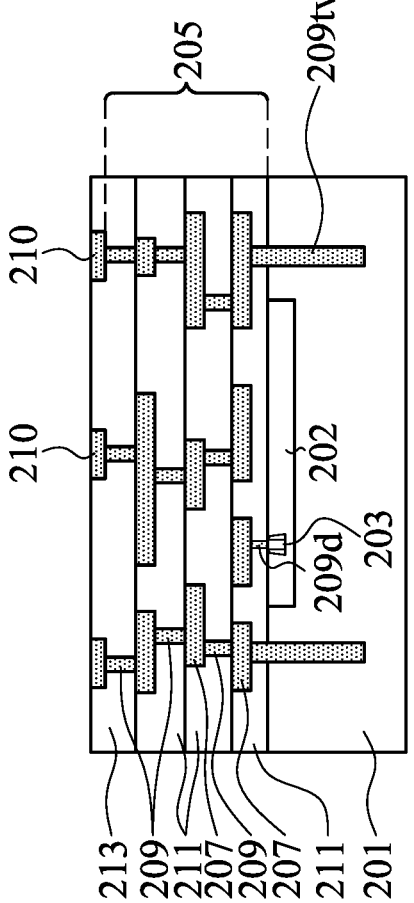
FIG. 2 illustrates a cross-sectional view of a second semiconductor device at an intermediate stage of manufacture, in accordance with some embodiments.

FIG. 2 illustrates a side view of a second exemplary semiconductor device 200, which likewise includes a substrate 201. For clarity, only a small portion of substrate 201, is shown. The second semiconductor device 200 may likewise be a die or a package component, in some embodiments. The substrate 201 may be a similar substrate as substrate 101 (FIG. 1), or a completely different type of substrate. While not a necessarily limiting factor, as a matter of guidance, the thermal expansion characteristics of substrate 201 and semiconductor device 200 generally is preferably matched, or at least compatible with, those of substrate 101 and/or semiconductor device 100. Active devices 203, such as transistors, may be formed in and/or on the substrate 201, for example, in device regions 202. In other embodiments, however, such as when semiconductor device 200 is an interposer or similar passive structure (i.e., a structure that has only electrical interconnection and/or passive devices such as capacitors, inductors, resistors, and the like), then no such active devices 203 are provided with semiconductor device 200.

As with semiconductor device 100, semiconductor device 200 also includes an interconnect structure 205, which in the illustrated embodiment has three layers of metal lines 207 embedded within respective dielectric layers 211. Metal lines 207 interconnect various active devices 203, if present, or other passive devices (not shown) if present and may be made of similar materials as metal lines 107 of FIG. 1 (although metal lines 207 of different materials formed using different processes relative to metal lines 107 is within the contemplated scope of this embodiment). Similarly, dielectric layers 211 may be similar to the materials of dielectric layers 111, but this again is not a limiting factor or a requirement of the present disclosure. FIG. 2 also discloses vias 209 electrically interconnecting different layers of metal lines 207. As above, a distinction between metal lines 207 and vias 209 is that metal lines generally extend in the X-Y plane and electrically interconnect different features within a layer, whereas vias extend in the Z direction and electrically interconnect features within different layers of interconnect structure 205 (as well as features that are not part of interconnect structure 205). While only three layers of metal lines 207 are illustrated in exemplary interconnect structure 205 of FIG. 2, one skilled in the art will recognize that only one or many such layers could be employed in a practical application.

As FIG. 2 further illustrates, interconnect structure 205 includes a topmost layer that includes metal lines 207 in the topmost layer and further includes bond pads 210 also formed within, or at least partially within topmost dielectric layer 213. As shown, topmost vias 209 formed within topmost dielectric layer 213 electrically connect topmost metal lines 207 to respective bond pads 210. As above, topmost metal lines 207 and topmost vias 209 may be formed using a trench-first or a via-first dual damascene process. The bond pads 210 may be formed using materials and processes similar to those described with respect to the bond pads 110.

As FIG. 2 further illustrates, interconnect structure 205 may also include a through-die via 209*tv* extending from the bottommost layer of the interconnect structure 205 down into the substrate 201. The through-die via 209*tv* may be exposed in a subsequent process by thinning the substrate 201 from a back side of the device or wafer. The through-die via 209*tv* may be formed using the same processes as the vias 209.

Figure 5A:
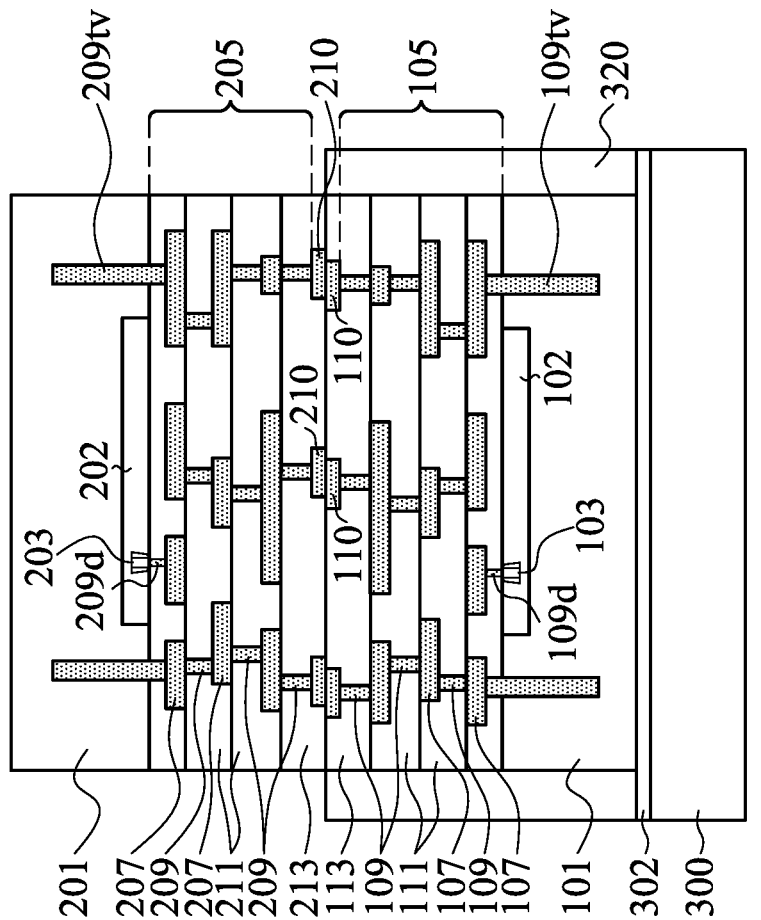
FIGS. 5A and 5B illustrate cross-sectional views of the second semiconductor device bonded with the first semiconductor device.
Figure 5B:
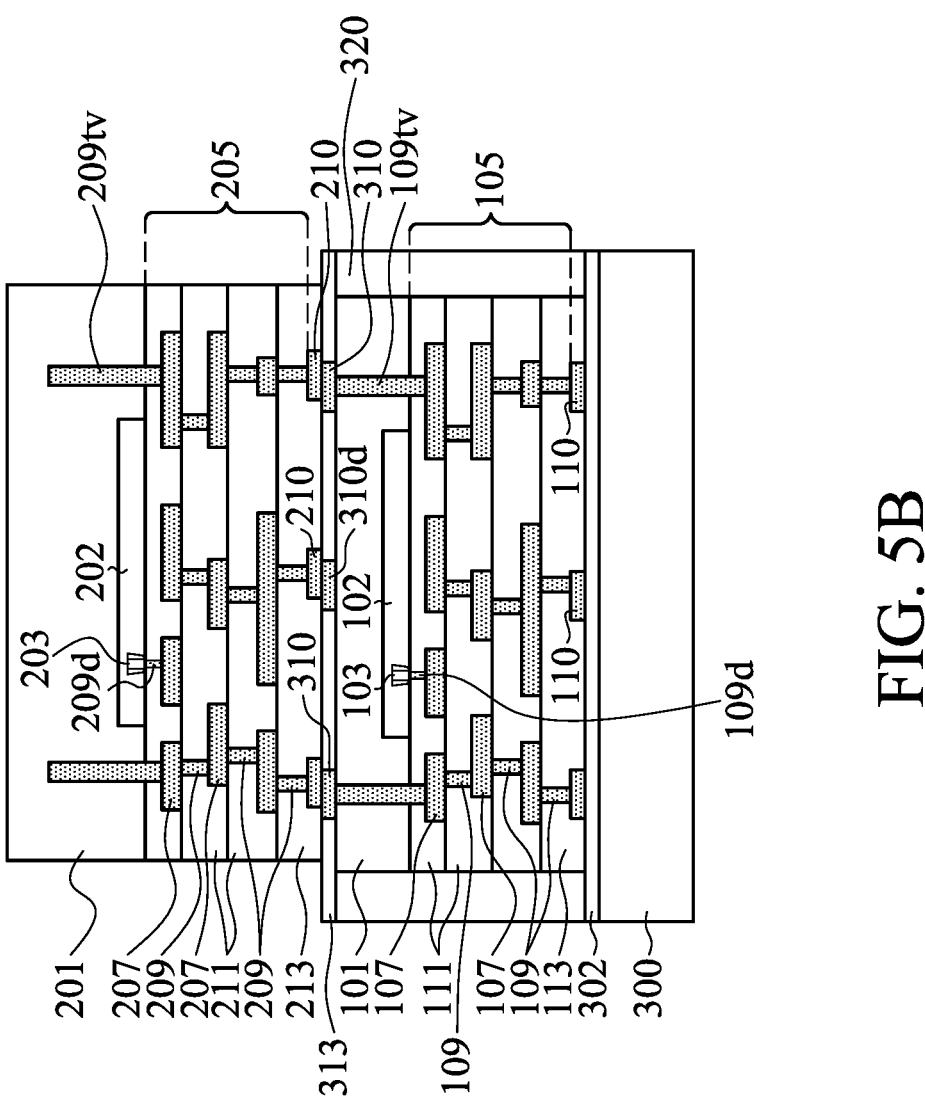

If the semiconductor device 200 is part of a wafer, then, in some embodiments, it can be singulated from the wafer prior to a subsequent process of attaching the semiconductor device 200 to the semiconductor device 100 (FIGS. 5A and 5B). The semiconductor device 200 may instead, however, remain in a wafer and a wafer-to-wafer bond may be performed. If singulated, the semiconductor device 200 may be singulated by any suitable process, such as by sawing, laser cutting, etching, or combinations thereof along dicing or scribe lines between semiconductor device regions such that multiples of the semiconductor devices 200 are released from the wafer.

Figure 3A:
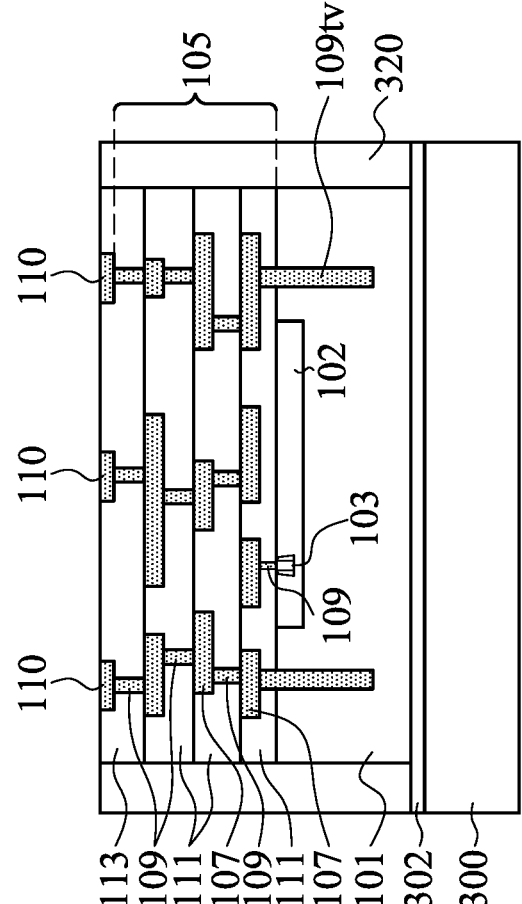
FIGS. 3A and 3B illustrate cross-sectional views of the first semiconductor device as a preparation for bonding together with the second semiconductor device, in accordance with some embodiments.
Figure 3B:
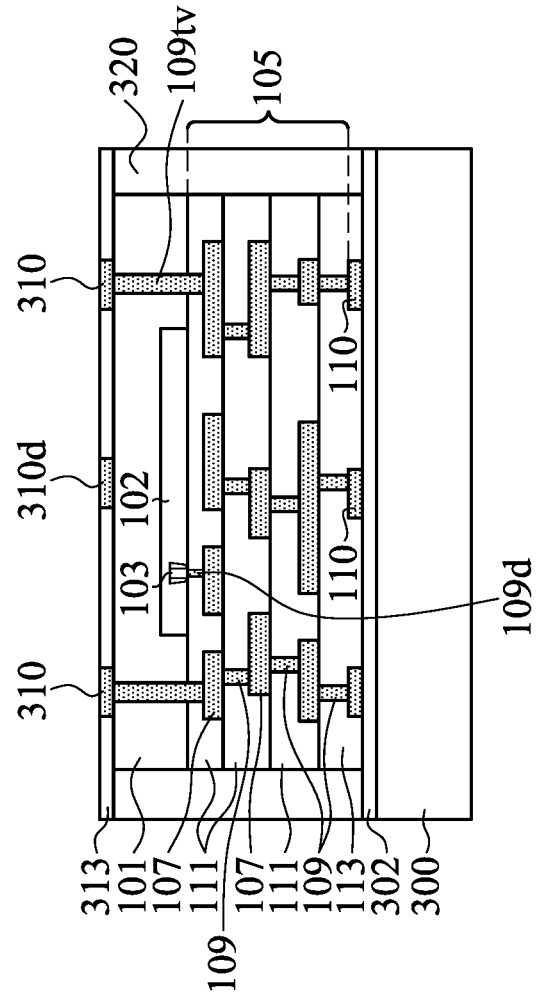

FIGS. 3A and 3B illustrate that the semiconductor device 100 (FIG. 1) may be attached to a carrier substrate 300. The semiconductor device may be attached face down or face up on the carrier substrate 300. Then, the semiconductor device may be laterally surrounded by an encapsulant 320. If the semiconductor device 100 is part of a wafer, then, in some embodiments, it can be singulated from the wafer prior to attaching the semiconductor device 100 to the carrier substrate 300. If the semiconductor device 100 remains in a wafer, then the encapsulant 320 can be omitted, and the carrier substrate 300 may also be omitted. If singulated, the semiconductor device 100 may be singulated by a process similar to that described above with respect to the semiconductor device 200.

The carrier substrate 300 is provided and a release layer 302 is formed on the carrier substrate 300. The carrier substrate 300 may be a glass carrier substrate, a ceramic carrier substrate, or the like. The carrier substrate 300 may be a wafer, such that multiple packages can be formed on the carrier substrate 300 simultaneously.

The release layer 302 may be formed of a polymer-based material, which may be removed along with the carrier substrate 300 from the overlying structures that will be formed in subsequent steps. In some embodiments, the release layer 302 is an epoxy-based thermal-release material, which loses its adhesive property when heated, such as a light-to-heat-conversion (LTHC) release coating. In other embodiments, the release layer 302 may be an ultra-violet

7

(UV) glue, which loses its adhesive property when exposed to UV lights. The release layer 302 may be dispensed as a liquid and cured, may be a laminate film laminated onto the carrier substrate 300, or may be the like. The top surface of the release layer 302 may be leveled and may have a high degree of planarity.

Although only one is shown for the sake of simplicity, one or more of the semiconductor devices 100 may be placed on the carrier substrate 300 and attached to the release layer 302. Each of the semiconductor devices 100 may be placed on the carrier substrate 300 by a pick and place process to place the semiconductor devices 100 on the release layer 302. In some embodiments, such as illustrated in FIG. 3A, the semiconductor device 100 is placed face up (back side down). In other embodiments, the semiconductor device 100 may be placed face down (back side up). It should be understood that each of the semiconductor devices 100 may have the same or different functionalities, and may be the same size as each other or different sizes from each other.

Next, a fill material, such as an insulating material or encapsulant 320 may be deposited over and laterally surrounding the semiconductor devices 100. The encapsulant 320 may include a dielectric material such as a resin, epoxy, polymer, oxide, nitride, the like, or combinations thereof, which may be deposited by any suitable process, such as by flowable CVD, spin-on, PVD, the like, or combinations thereof. A planarization process may be used to level the upper surface of the encapsulant 320 with the upper surfaces of the semiconductor device 100. The planarization process may include a grinding and/or a chemical mechanical polishing (CMP) processes. In FIG. 3B, the planarization process may be continued until the through-die vias 109*tv* are exposed through the semiconductor substrate 101 of each of the semiconductor devices 100.

In FIG. 3B, a bonding layer 313 and bond pads 310 are formed. The bonding layer 313 may be formed over the upper surface of the encapsulant 320 and the substrate 101. Bond pads 310 are formed in the bonding layer 313. The bond pads 310 may include active bond pads which are physically coupled to a through-die via 109*tv*, and dummy bond pads 310*d* which are not connected to any metal features of the semiconductor devices 100. For the sake of simplicity referring to bond pads 310 includes both active bond pads and dummy bond pads, unless otherwise noted. The bonding layer 313 may be formed of any suitable insulating layer, such as silicon oxide, silicon nitride, silicon carbide, silicon oxycarbide, silicon oxynitride, the like, or combinations thereof, and may be deposited using any suitable technique, such as CVD, PVD, spin on, etc. To form the bond pads 310, openings may be formed in the bonding layer 313 according to the positions and shapes of the bond pads 310. The openings may be formed using photo resists (not shown) and/or hard masks (not shown) which are formed and patterned over the bonding layer 313 to aid the formation of the openings for the bond pads 310. In some embodiments, an anisotropic etch or wet etch is performed to form the openings for the bond pads 310. The openings for the bond pads 310 may expose upper surfaces of the through-die vias 109*tv*.

Next, a diffusion barrier and metallic material may be deposited in the openings to form the bond pads 310. The diffusion barrier and metallic material may be deposited using materials and techniques such as those discussed above for the formation of the bond pads 110 and vias 109. A planarization process such as a Chemical Mechanical Polish (CMP) process may then be performed to remove excess portions of the metallic material and the diffusion barrier, until the bond pads 310 are exposed.

Figure 4A:
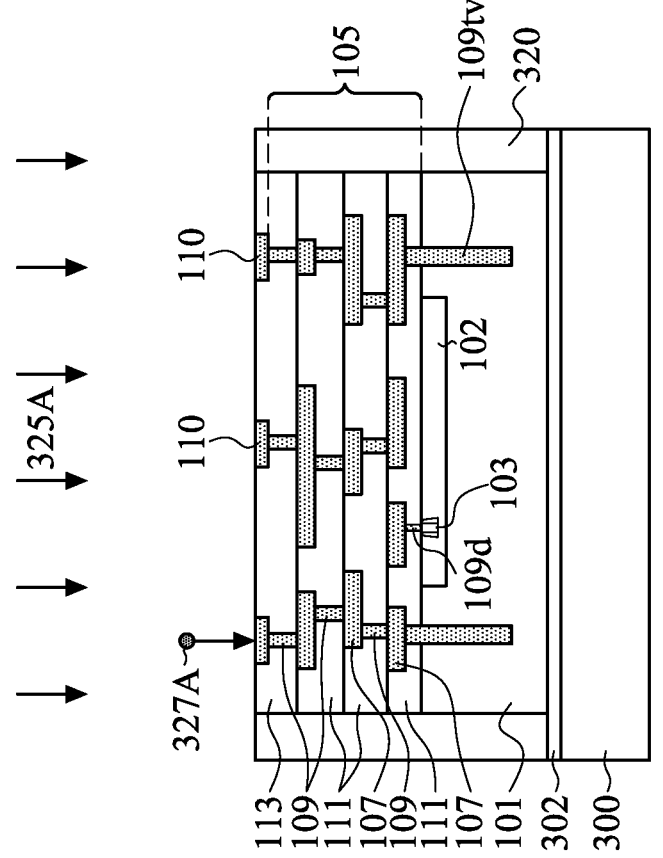
FIGS. 4A, 4B, and 4C illustrate an implantation process on the first and/or second semiconductor devices, in accordance with some embodiments.
Figure 4B:
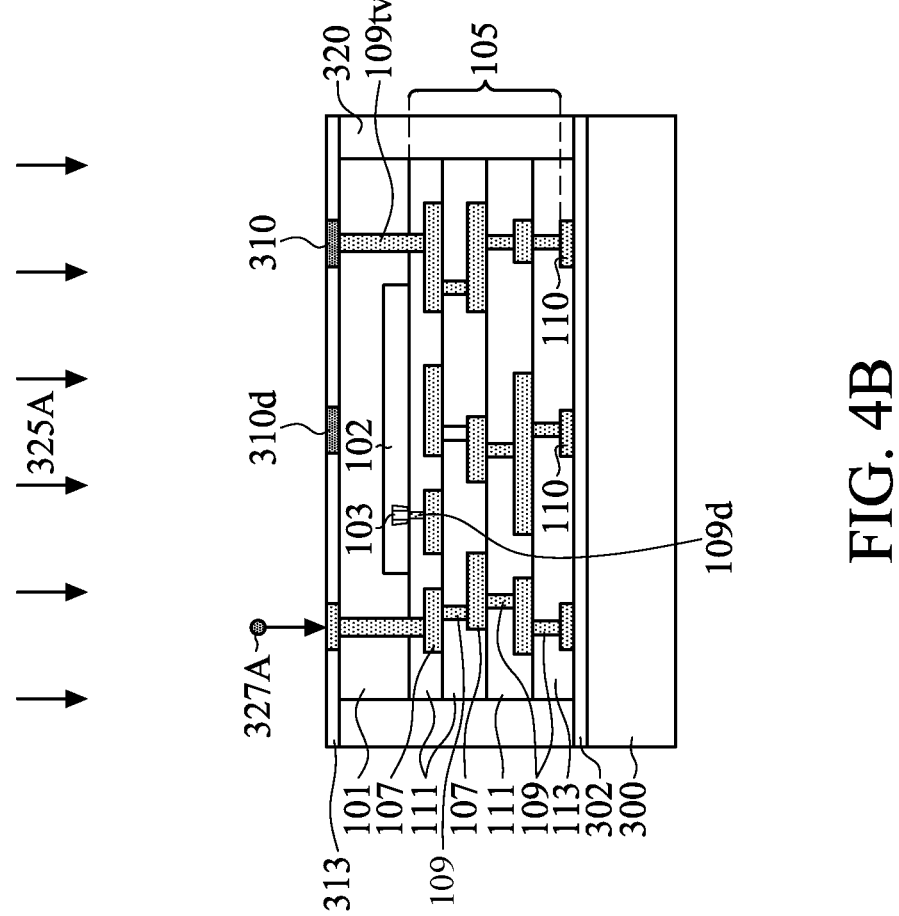
Figure 4C:
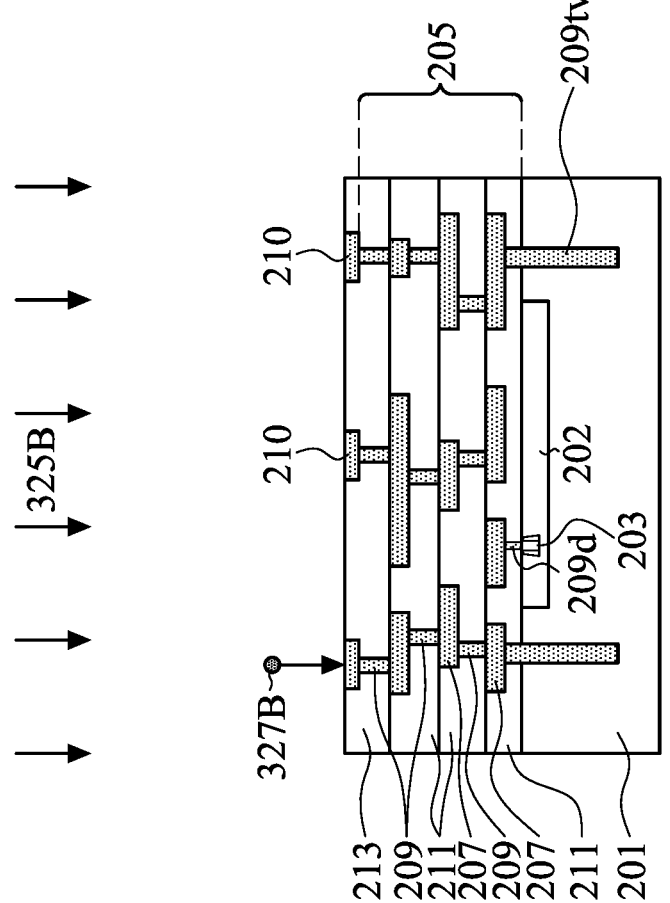

In FIGS. 4A, 4B, and 4C an implantation process 325A or 325B is performed to implant or dope metal ions 327A or 327B into the bond pads 110 (FIG. 4A), the bond pads 310 (FIG. 4B), and/or the bond pads 210 (FIG. 4C). The implantation process 325A implants or dopes the metal ions 327A and the implantation process 325B implants or dopes the metal ions 327B. In some embodiments, the metal ions 327A and metal ions 327B may be the same materials, while in other embodiments, they may be different. For the sake of simplicity, implantation processes 325A and 325B may be referred to as implantation process 325, unless otherwise noted, and metal ions 327A and metal ions 327B may be referred to as metal ions 327, unless otherwise noted.

The metal ions 327 may be doped utilizing an implantation apparatus (not shown). The implantation apparatus may include various components to form and direct an ion beam to a desired region of the semiconductor devices 100 and semiconductor devices 200, such as the bond pads 110, 210, and/or 310, or particular portions thereof. The implantation apparatus may include components such as an ion source to produce ions, a mass analysis magnet to filter out undesired charge-to-mass ratio ions and produce a coherent ion beam, a linear accelerator to add energy to the ion beam, and a converging unit to condense, focus, and direct the ion beam. The implantation apparatus may include a wafer stage to hold the carrier substrate 300, for example, and move the semiconductor devices 100 and 200 in the x-y plane relative to the ion beam which may be delivered in the z-axis. Thus, known processes can be used to produce and provide the metal ions 327.

The metal ions 327 may include one or more of tantalum, titanium, manganese, cobalt, iron, tin, or germanium, though other species may be used. As compared to the material of the bond pads 110, 210, and 310, the metal ions may be deposited to have a concentration between about 0.2% and 8% of the bond pads 110, 210, and 310. That is, following implantation the bond pads 110, 210, and 310 may be between 92% and 99.8% the metallic material described above, such as copper or a copper alloy, and between 0.2% and 8% the metal ions 327.

In some embodiments, the metal ions 327 may be implanted in both the bond pads 210 and the bond pads 110/310. In some embodiments, the metal ions 327 may be implanted in one or the other of the bond pads 210 and the bond pads 110/310. In some embodiments, the metal ions 327 may be implanted to a greater concentration in the bond pads 210 versus the bond pads 110/310 or may be deposited to a greater concentration in the bond pads 110/310 versus the bond pads 210. In some embodiments, the metal ions 327A implanted in the bond pads 110/310 are a different species than the metal ions 327B implanted in the bond pads 210. In some embodiments, the metal ions 327 implanted in the bond pads 110/310 and/or bond pads 210 are concentrated at the edges of the bond pads, where an overlay offset is more likely to occur.

The various configurations for implanting the metal ions 327 are discussed in further detail below with respect to FIGS. 7, 9A, 10A, 11A, 12A, 13A, and 14A.

In some embodiments, the metal ions 327 may be doped into the bond pads 110, 210, and/or 310 utilizing alternative processes. For example, metal ions may be in situ doped while depositing the metallic material of the bond pads 110, 210, and/or 310. For example, metal ions may be provided into an electroless plating solution or may be provided in a deposition chamber during a PVD or CVD process for depositing the metallic material of the bond pads 110, 210, and/or 310.

In FIGS. 5A and 5B, the semiconductor devices 200 are flipped over and their faces (front-sides) are bonded to the front side of the semiconductor device 100 in FIG. 5A or the back side of the semiconductor device 100 in FIG. 5B. As noted above, the semiconductor devices 200 may be singulated from a wafer and a chip-on-wafer bond may be performed, in some embodiments. In other embodiments, the semiconductor devices 200 may remain in the wafer form and a wafer-on-wafer bond may be performed. In such embodiments, the lateral extents of the semiconductor device 200 may extend at least to the lateral extents of the encapsulant 320 or the semiconductor device 100 (if the semiconductor device 100 remains in the wafer form and the encapsulant 320 is omitted).

When the semiconductor device 200 is aligned with the semiconductor device 100, an overlay offset may occur such that the bond pads 110/310 do not exactly align with the bond pads 210. A magnified view of the overlay offset is provided with respect to FIG. 7. The bond pads 210, for example, may overlap a portion of the barrier layer that surrounds the bond pads 110/310. As bond pad sizes are reduced, however, so too are the thicknesses of the barrier layers and so the overlap may extend beyond just the barrier layer and may also overlap the dielectric layer 113/313, leading to the diffusion problems described above and dielectric breakdown. Overlay offset can be caused by misalignment of the semiconductor device 200, pattern errors in the formation of the bond pads, and/or other process conditions.

After aligning the semiconductor device 200 to the semiconductor device 100, the bonding process is performed. The bonding process may be called a hybrid bonding process and includes bonding both the bond pads and the dielectric layers of the semiconductor device 200 and the semiconductor device 100 together. The bond pads are bonded together in a solderless metal-to-metal bond and the dielectric layers are bonded together in a fusion bond where the dielectric materials of the dielectric layers form crosslinked bonds.

In the bonding process, the bond pads 210 are aligned to and contacted to the bond pads 110/310. The dielectric layers 213 are also contacted to the dielectric layers 113/313. An anneal may then be performed to directly bond the conductive materials and fusion bond the insulating materials together. The anneal causes the inter-diffusion of the metals in the bond pad/bond pad of bond pad 210 and bond pad 110/310 to cause a direct metal-to-metal bond. The annealing time may be between about 1 hour and 3 hours, such as about 1.5 hours. The annealing temperature may be in the range between about 100° C. and 300° C., such as between about 250° C. and about 300° C.

In some embodiments, the bonded metallic materials of the bond pads 110/310 and bond pads 210 may have distinguishable interfaces. In other embodiments, the interface may be indistinguishable. For the sake of clarity, the enlarged views of the bond pads 110/310 and bond pads 210, discussed below with respect to FIGS. 7, 8, 9A, 9B, 10A, 10B, 11A, 11B, 12A, 12B, 13A, 13B, 14A, and 14B show a distinguishable interface pre-bond and an indistinguishable interface post-bond.

The dielectric layer 213 may also be fusion bonded to the dielectric layer 113/313, with bonds formed therebetween. For example, the atoms (such as oxygen atoms) in one of the dielectric layer 113/313 and/or 213 can form chemical or covalence bonds (such as O—H bonds) with the atoms (such as hydrogen atoms) in the other one of the dielectric layers 113/313 and/or 213. The resulting bonds between the dielectric layer 113/313 and 213 are insulator-to-insulator bonds, which may be inorganic-to-polymer, polymer-to-polymer, or inorganic-to-inorganic bonds in accordance with various embodiments. Slight variations in surfaces of the bonding structures can be overcome through the annealing process while pressure keeps the structures together. In some embodiments a pressing force of about 1 to 10 Newtons can be exerted, such as about 6 Newtons, to press the semiconductor device 200 to the semiconductor device 100. Hybrid bonding can occur in an environment from about 1 atm to about 100 atm, such as about 5 atm. Expansion of materials under anneal temperatures can complete the bonding and substantially eliminate voids.

Figure 6B:
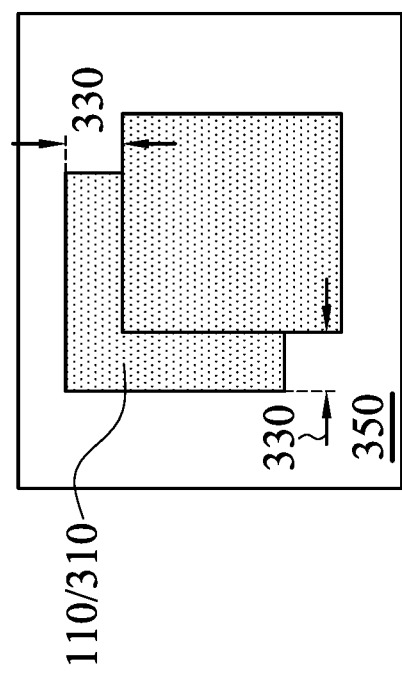
FIGS. 6A and 6B illustrate an overlay offset in a horizontal cross-sectional view, according to some embodiments.
Figure 6A:
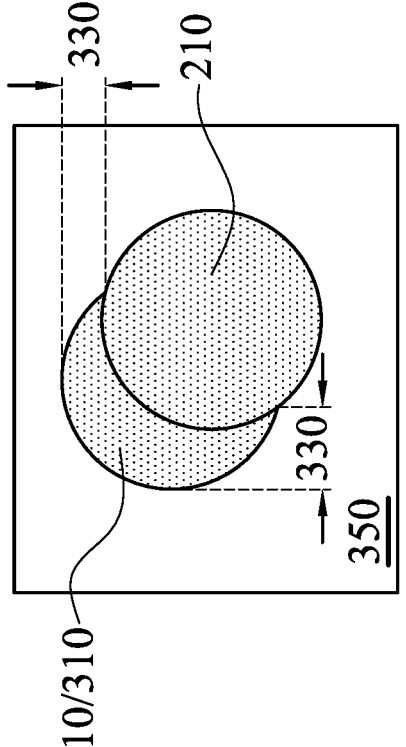
Figure 6A:
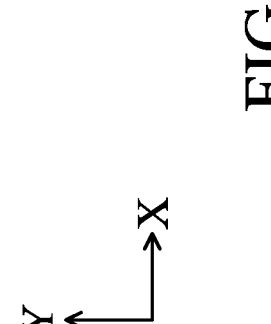

FIGS. 6A and 6B show a combined view of a horizontal cross section of the interface 350 between the bond pad 110/310 and the bond pad 210. The view includes the bond pad 110/310 and the bond pad 210. In FIG. 6A, the bond pads 110/310 and bond pads 210 are circular. In FIG. 6B, the bond pads 110/310 and bond pads 210 are rectangular. FIGS. 6A and 6B also illustrate an overlay offset 330 which can occur in one or both of the x-direction and the y-direction in the xy-plane.

Figure 7:
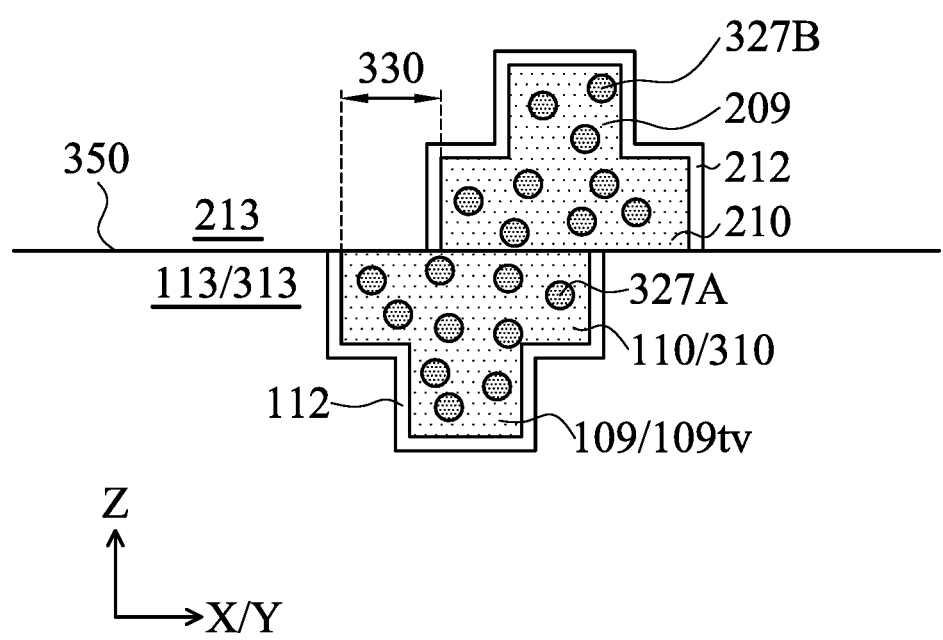
FIG. 7 illustrates an enlarged view of a bond pad of the first semiconductor device and a bond pad of the second semiconductor device prior to a bonding process, in accordance with some embodiments.

FIG. 7 illustrates an enlarged view of a representative one of the bond pad 110/310 and the bond pad 210, prior to the bonding process. An interface 350 is formed between the semiconductor device 200 and the semiconductor device 100. The dielectric layer 213 of the semiconductor device 200 can contact the dielectric layer 113 of the semiconductor device 100 (from FIG. 5A) or can contact the dielectric layer 313 of the semiconductor device 100 (from FIG. 5B). A conductive barrier layer 112 surrounds the bond pad 110/310 and a conductive barrier layer 212 surrounds the bond pad 210. It should be appreciated that in some embodiments, the bond pad 110/310 may be formed in the same process as the underlying via 109 or through-die via 109tv, resulting in the t-shaped structures illustrated in FIG. 7, the t-shaped structure being surrounded by the conductive barrier layer 112 or 212. In other embodiments, however, the bond pad 110 may be formed in a separate process, in which case the conductive barrier layer 112 may surround only the bond pad 110/310 and/or 210 and not the via 109/109tv and/or 209.

FIG. 7 further illustrates the overlay offset 330 in the x or y direction. As illustrated in FIG. 7, the overlay offset 330 causes the bond pad 210 to overlap and contact the dielectric layer 113/313 and causes the bond pad 110/310 to overlap and contact the dielectric layer 213. Thus, diffusion from the bond pads can occur in both directions. In some embodiments, the overlay offset 330 may be between about 50 nm and about 300 nm. The thickness of the conductive barrier layers 112 or 212 may be between about 5 nm and about 100 nm. As such, the overlay offset 330 can cause an overlap of the bond pads onto the dielectric layers of about 45 nm to about 295 nm.

FIG. 7 further illustrates the metal ions 327A implanted into the bond pad 110/310 and the metal ions 327B implanted into the bond pad 210. It should be appreciated that the size of the ions are exaggerated. In FIG. 7, the species of the metal ions 327A and the metal ions 327B are the same. Further, the concentration of the metal ions 327A and the metal ions 327B in their respective bond pads are also the same, within process variations.

Figure 8:
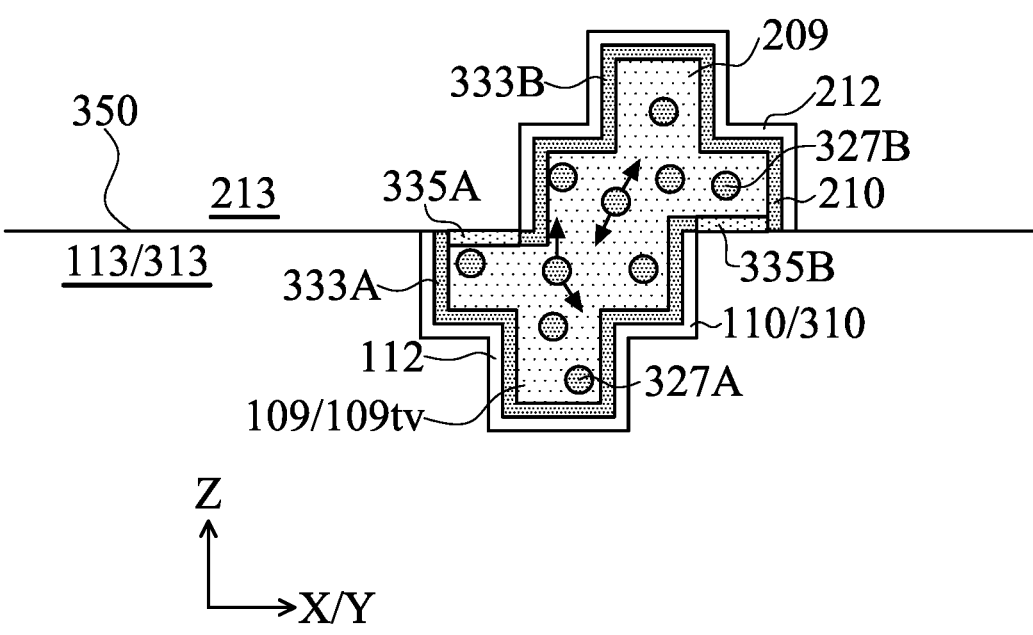
FIG. 8 illustrates an enlarged view of a bond pad of the first semiconductor device and a bond pad of the second semiconductor device after a bonding process, in accordance with some embodiments.

In FIG. 8, during the bonding process, at least some of the metal ions 327A and metal ions 327B diffuse to the outer surfaces of the bond pads 110/310 and the bond pads 210.

The outer surfaces include the side surfaces, the bottom surfaces, and the top surfaces. Metal ions 327A can also diffuse into the bond pads 210 and metal ions 327B can diffuse into the bond pads 110/313. The metal ions 327A and 327B diffuse to form a second barrier layer 333A and 333B, surrounding the bond pad 110/310 and the bond pad 210, respectively. Where the second barrier layer 333A contacts the dielectric layer 213 the metal ions 327A can oxidize to form a metal oxide. Oxygen can come from moisture at the interface 350 and/or the material composition of the dielectric layer 213. And because the metal ions 327 are ions, they can readily bond with available oxygen to form the metal oxide. Thus, the second barrier layer 333A includes a metal oxide barrier 335A portion at the overlay offset interface which includes the metal ion 327A and a metal oxide of the metal ion 327A. Similarly, where the second barrier layer 333B contacts the dielectric layer 113/313 the metal ions 327B can oxidize to form a metal oxide. Oxygen can come from moisture at the interface 350 and/or the material composition of the dielectric layer 113/313. Thus, the second barrier layer 333B includes a metal oxide barrier 335B portion at the overlay offset interface which includes the metal ion 327B and a metal oxide of the metal ion 327B.

Although much of the metal ions 327 will diffuse to the sidewalls, tops, and bottoms of the bond pads 110/310 and bond pads 210, some of the metal ions 327 can remain distributed about the conductive materials of the bond pads 110/310 and bond pads 210. In some embodiments, the concentration, for example, of the metal ions 327 in the middle of the conductive materials of the bond pads 110/310 and bond pads 210 may be between about 5% and 25% of the concentration in the same region before the bonding process.

The metal ions have a higher diffusion coefficient than the diffusion coefficient of the metallic material of the bond pads 110, 210, and/or 310. Due to the annealing temperature between 100° C. to 300° C. used in the bonding process, the metal ions 327 diffuse more rapidly than the metallic material of the bond pads, thereby forming the second barrier layer 333A and 333B. When the metal ions 327 diffuse to the outer surfaces of the bond pads, the conductive barrier layer 112 and 212 stop the diffusion so that the metal ions 327 gather at the inner surfaces of the conductive barrier layer 112 and 212. When the metal ions 327 diffuse to the interface 350 between the bond pad 110/310 and the bond pad 210, the metal ions bond with available oxygen and become the metal oxide barrier 335A and metal oxide barrier 335B.

In embodiments where the conductive barrier layer 112 and/or 212 extend along the sidewalls of the via 109/109ty and/or 209, the metal ions 327 can also diffuse into the vias and along the portion of the conductive barrier layer 112 and/or 212 in the vias 109/109ty and/or 209.

FIGS. 7 and 8 illustrate embodiments where the metal ion 327A species and the metal ion 327B species are the same and the doping concentration of the metal ions 327 are the same in each of the bond pads 110/310 and 210. The resulting second barrier layer 333A and 333B have about the same thickness. In addition, the resulting metal oxide barrier 335A portion of the second barrier layer 333A and the metal oxide barrier 335B portion of the second barrier layer 333B may also have about the same thicknesses. Also, the remaining concentration of metal ions 327 in each of the bond pad 110/310 and bond pad 210 is about the same.

FIGS. 9A and 9B, 10A and 10B, 11A and 11B, 12A and 12B, 13A and 13B, and 14A and 14B illustrate various embodiments of the implantation process and bonding process as described above, for example, with respect to FIGS. 7 and 8. FIGS. 9A, 10A, 11A, 12A, 13A, 14A, and 15A each illustrate the bond pads 110/310 and 210 after implantation and before the bonding process, a view similar to FIG. 7. FIGS. 9B, 10B, 11B, 12B, 13B, 14B, and 15B each illustrate the respective bond pads 110/310 and 210 after the bonding process, a view similar to FIG. 8. The configurations may be utilized together and combined as appropriate.

Figure 9A:
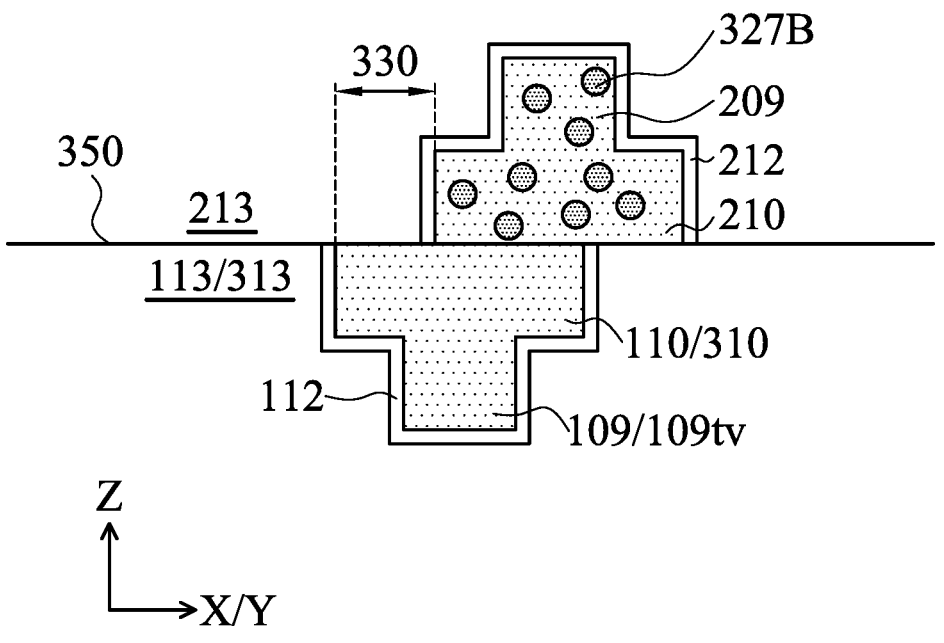
FIGS. 9A and 9B, 10A and 10B, 11A and 11B, 12A and 12B, 13A and 13B, and 14A and 14B illustrate enlarged views of a bond pad of the first semiconductor device and a bond pad of the second semiconductor device before and after a bonding process, in accordance with various embodiments.
Figure 9B:
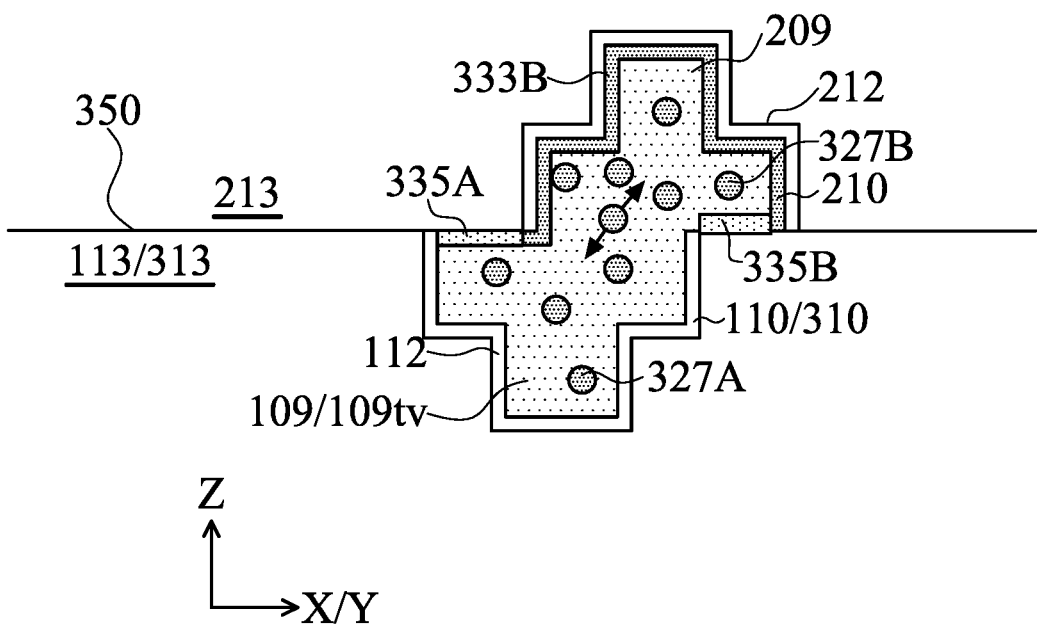

In FIGS. 9A and 9B, only the bond pad 210 is implanted with the metal ions 327B. As a result, after the bonding process, the metal ions 327B diffuse into the outer surfaces of the bond pad 210, resulting in the second barrier layer 333B. The metal ions 327B may also diffuse into the bond pad 110/310 and a second barrier layer 333A may also result, but will be much thinner, such as between about 1% and 20% of the thickness of the second barrier layer 333B. Both the metal oxide barrier 335A and 335B are formed, however, the metal oxide barrier 335B is thicker than the metal oxide barrier 335A. In some embodiments, for example, the metal oxide barrier 335B may be about 1.5 to 5 times thicker than the metal oxide barrier 335A. Further the metal ion concentration remaining in the metallic material of the bond pad 210 is higher than the metal ion concentration that diffuses into the bond pad 110/310, which is not zero.

Figure 10A:
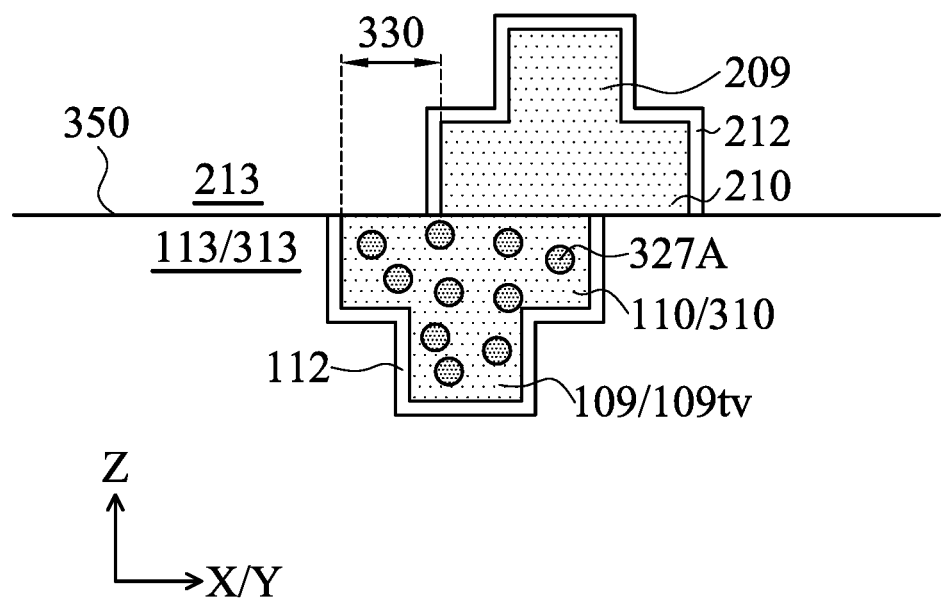
Figure 10B:
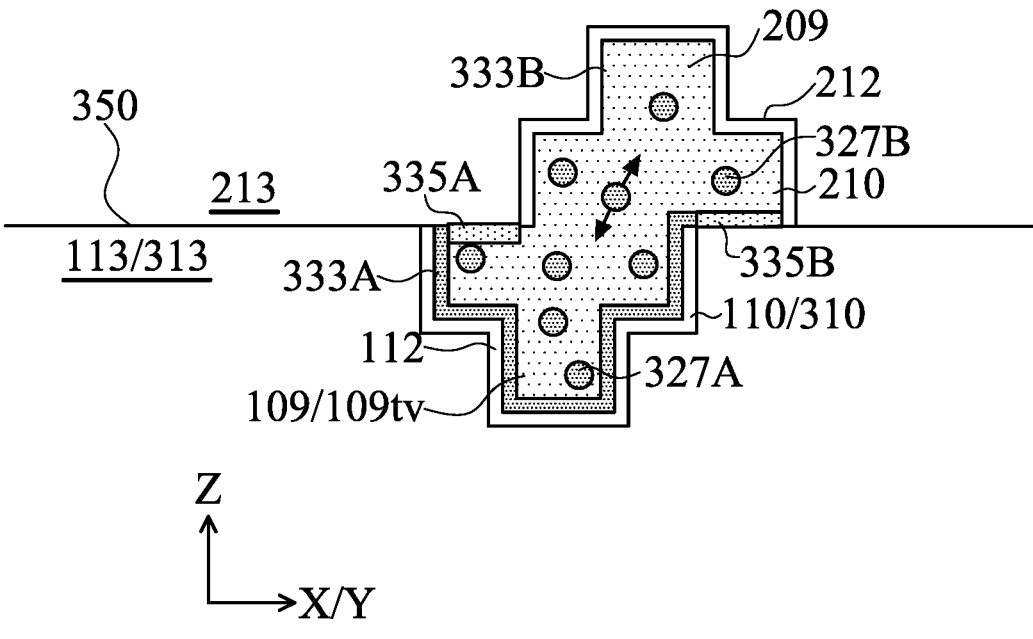

In FIGS. 10A and 10B, only the bond pad 110/310 is implanted with the metal ions 327A. As a result, after the bonding process, the metal ions 327A diffuse into the outer surfaces of the bond pad 110/310, resulting in the second barrier layer 333A. The metal ions 327A may also diffuse into the bond pad 210 and a second barrier layer 333B may also result, but will be much thinner, such as between about 1% and 20% of the thickness of the second barrier layer 333A. Both the metal oxide barrier 335A and 335B are formed, however, the metal oxide barrier 335A is thicker than the metal oxide barrier 335B. In some embodiments, for example, the metal oxide barrier 335A may be about 1.5 to 5 times thicker than the metal oxide barrier 335B. Further the metal ion concentration remaining in the metallic material of the bond pad 110/310 is higher than the metal ion concentration that diffuses into the bond pad 210, which is not zero.

Figure 11A:
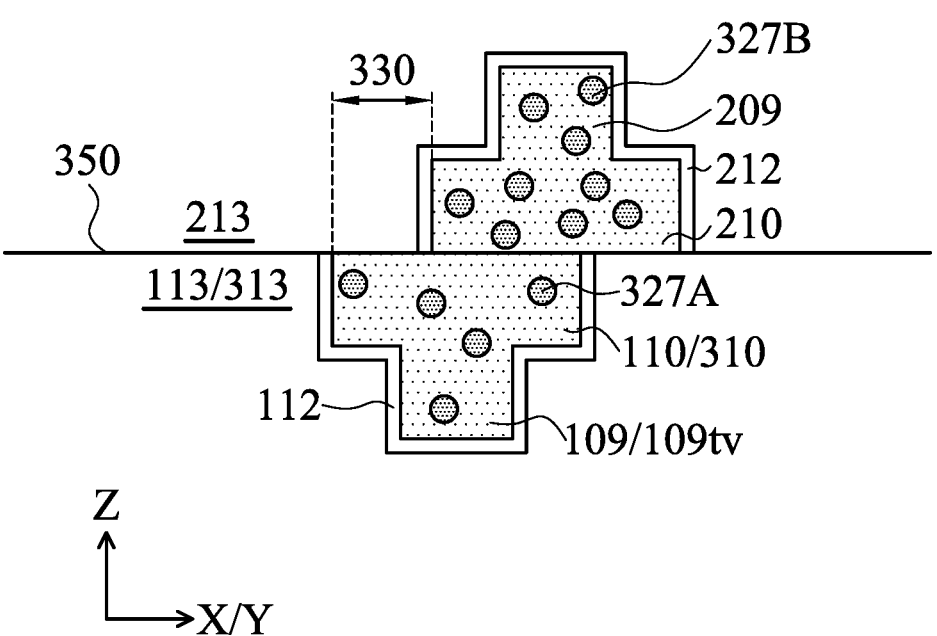
Figure 11B:
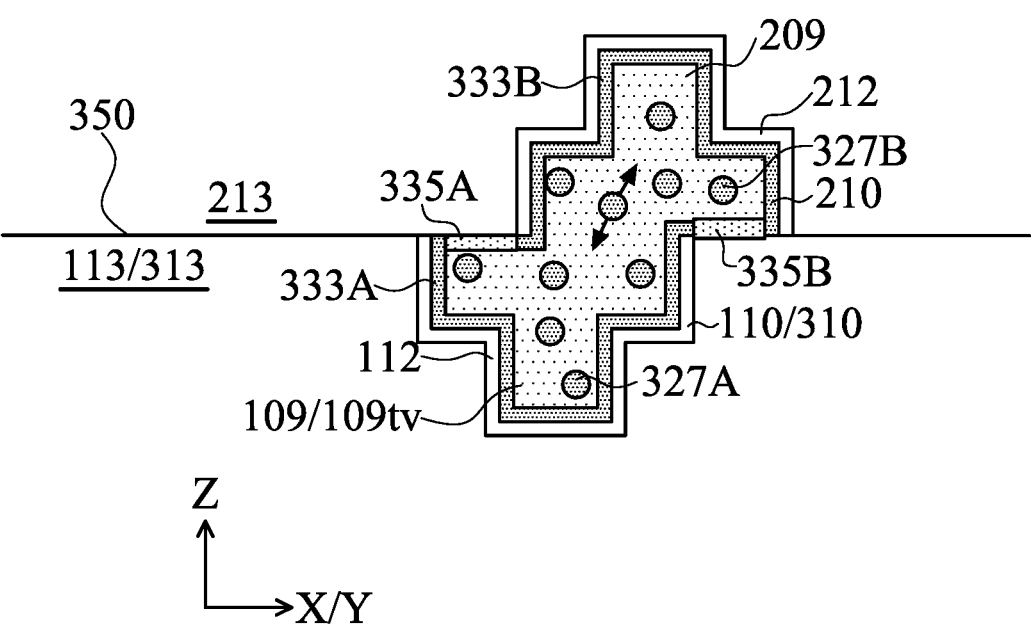

In FIGS. 11A and 11B, both the bond pad 110/310 and the bond pad 210 are implanted with the metal ions 327A and 327B, respectively. However, the bond pad 210 is implanted with the metal ions 327B to a greater concentration than the metal ions 327A implanted in the bond pad 110/310. In some embodiments, for example the ratio of concentration of metal ions 327B to 327A may be between about 10:1 and 2:1. As a result, after the bonding process, the metal ions 327B diffuse into the outer surfaces of the bond pad 210, resulting in the second barrier layer 333B, and the metal ions 327A diffuse into the outer surface of the bond pad 110/310, resulting in the second barrier layer 333A. However, the second barrier layer 333B is thicker than the second barrier layer 333A, due to the increased dopant concentration. The metal ions 327A may also diffuse into the bond pad 210 and the metal ions 327B may diffuse into the bond pad 110/310. Because the concentration was higher in the bond pad 210, a gradient of concentration of metal ions 327B remaining in the metallic material of the bond pads 210 and bond pads 110/310 results which is greater in the bond pad 210 and decreases into the bond pad 110/310. Both the metal oxide barrier 335A and 335B are formed, however, the metal oxide barrier 335B is thicker than the metal oxide barrier 335A. In some embodiments, for example, the metal oxide barrier 335B may be about 1.5 to 5 times thicker than the metal oxide barrier 335A.

Figure 12A:
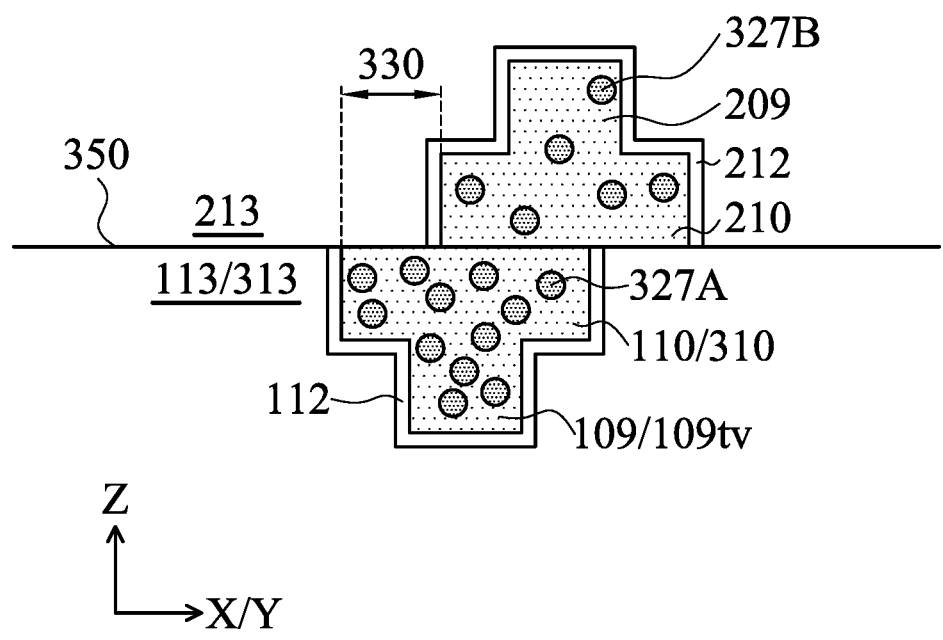
Figure 12B:
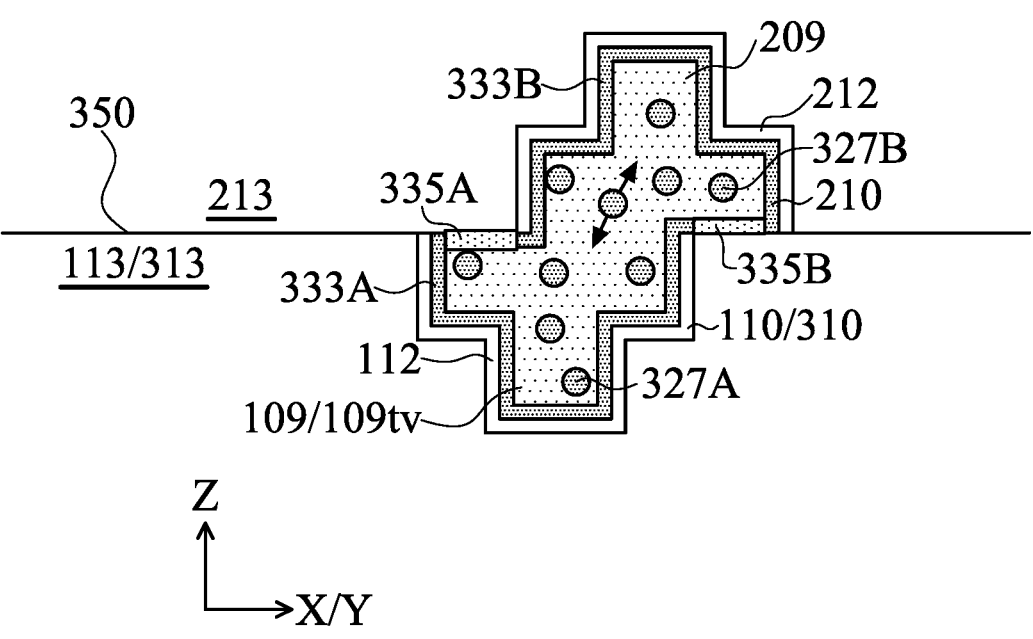

In FIGS. 12A and 12B, both the bond pad 110/310 and the bond pad 210 are implanted with the metal ions 327A and 327B, respectively. However, the bond pad 110/310 is implanted with the metal ions 327A to a greater concentration than the metal ions 327B implanted in the bond pad 210. In some embodiments, for example the ratio of concentration of metal ions 327A to 327B may be between about 10:1 and 2:1. As a result, after the bonding process, the metal ions 327A diffuse into the outer surfaces of the bond pad 110/310, resulting in the second barrier layer 333A, and the metal ions 327B diffuse into the outer surface of the bond pad 210, resulting in the second barrier layer 333B. However, the second barrier layer 333A is thicker than the second barrier layer 333B, due to the increased dopant concentration. The metal ions 327B may also diffuse into the bond pad 110/310 and the metal ions 327A may diffuse into the bond pad 210. Because the concentration was higher in the bond pad 110/310, a gradient of concentration of metal ions 327A remaining in the metallic material of the bond pads 110/310 and bond pads 210 results which is greater in the bond pad 110/310 and decreases into the bond pad 210. Both the metal oxide barrier 335A and 335B are formed, however, the metal oxide barrier 335A is thicker than the metal oxide barrier 335B. In some embodiments, for example, the metal oxide barrier 335A may be about 1.5 to 5 times thicker than the metal oxide barrier 335B.

Figure 13A:
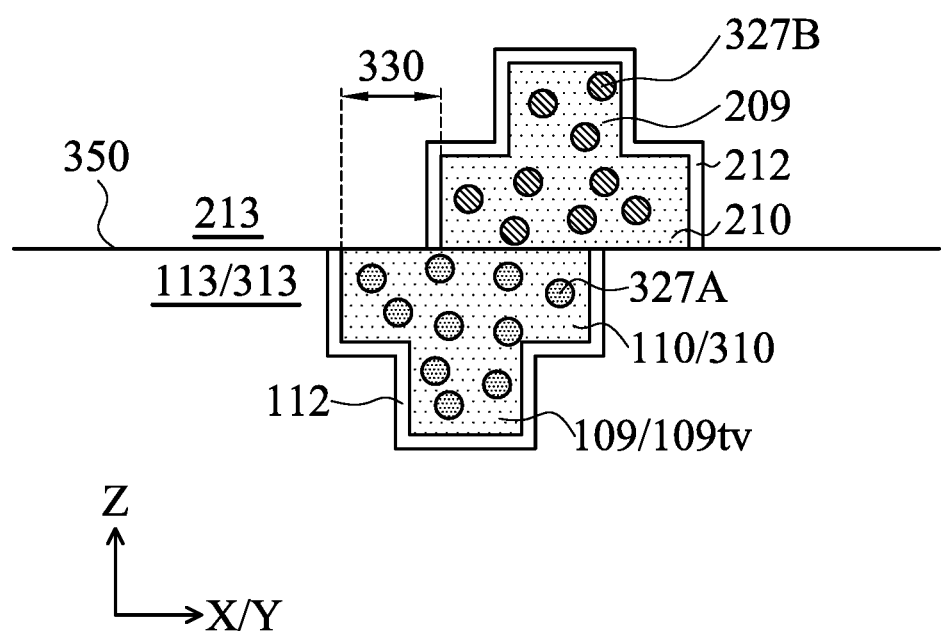
Figure 13B:
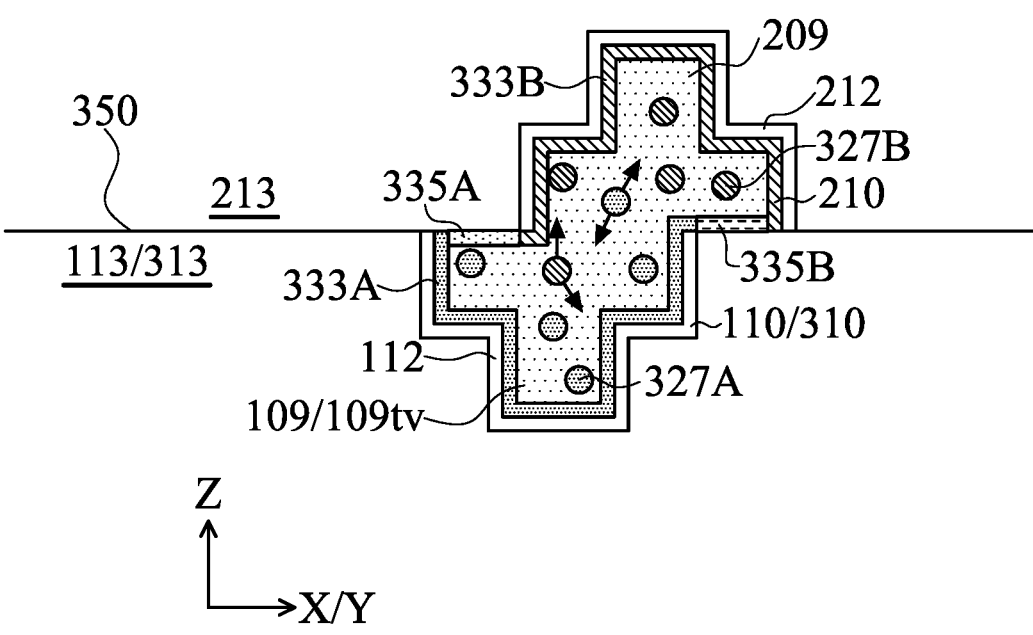

In FIGS. 13A and 13B, both the bond pad 110/310 and bond pad 210 are implanted with the metal ions 327A and 327B, respectively. However, the bond pad 110/310 is implanted with the metal ions 327A which is a first species, and the bond pad 210 is implanted with the metal ions 327B which is a second species different than the first species. The implanted concentrations of each of metal ions 327A and 327B may be the same or different. After the bonding process, the metal ions 327A diffuse into the outer surfaces of the bond pad 110/310, resulting in the second barrier layer 333A, and the metal ions 327B diffuse into the outer surface of the bond pad 210, resulting in the second barrier layer 333B. The second barrier layer 333A has a different material composition than the second barrier layer 333B. The species of the metal ions 327A will also diffuse into the bond pad 210 and the species of the metal ions 327B will also diffuse into the bond pads 110/310 such that both the bond pad 110/310 and bond pad 210 each contain both separate species of metal ions 327A and 327B.

The metal oxide barrier 335A is primarily an oxide of the metal ion 327A and the metal oxide barrier 335B is primarily an oxide of the metal ion 327B. However, the metal oxide barrier 335A may also contain an oxide of the metal ion 327B and the metal oxide barrier 335B may also contain an oxide of the metal ion 327A. In the metal oxide barrier 335A, a ratio of the metal oxide of the metal ion 327A to the metal oxide of the metal ion 327B may be between about 2:1 to about 25:1. Similarly, in the metal oxide barrier 335B, a ratio of the metal oxide of the metal ion 327B to the metal oxide of the metal ion 327A may be between about 2:1 to about 25:1.

Figure 14A:
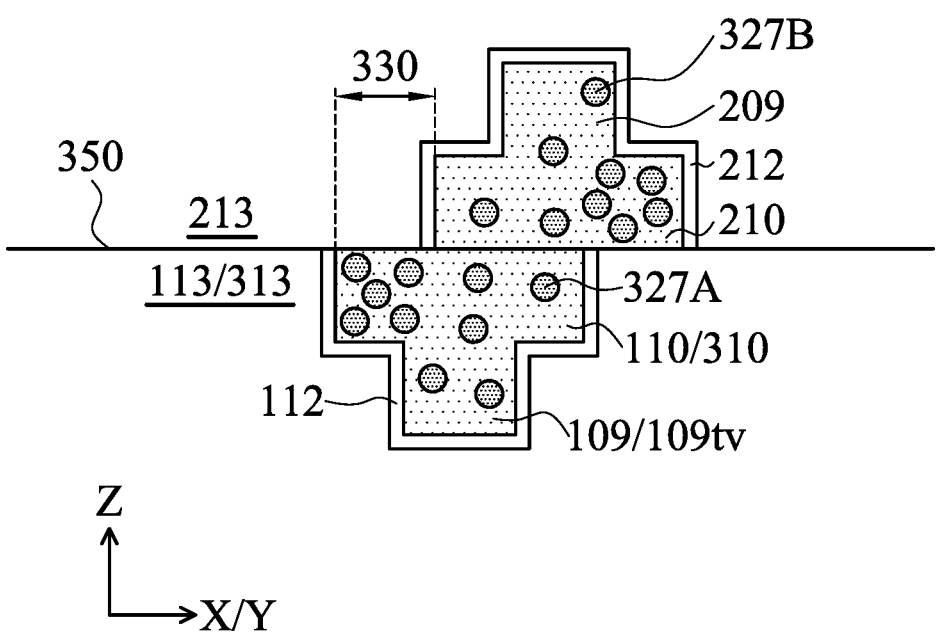
Figure 14B:
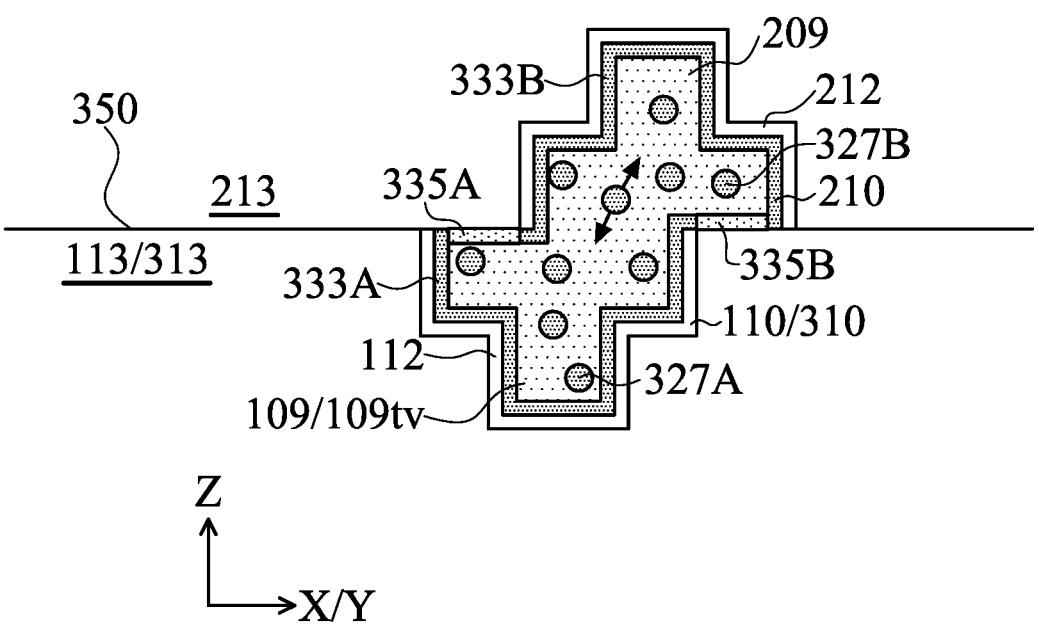

In FIGS. 14A and 14B, a prediction may be made about the overlay offset 330 and the dopant concentration can be tuned to provide a higher concentration of metal ions 327 in respective portions of the bond pad 110/310 and the bond pad 210. In the example illustrated in FIG. 14A, for example, the concentration of metal ions 327A in the edge of the bond pad 110/310 may be about 2 to 5 times higher than in other portions of the bond pad 110/310. Similarly, the concentration of metal ions 327B in the edge of the bond pad 210 may be about 2 to 5 times higher than in other portions of the bond pad 210. In FIG. 14B, after the bonding process, the metal oxide barrier 335A and metal oxide barrier 335B which results may be relatively thicker than other portions of the second barrier layer 333A and 333B, respectively. For example, in some embodiments, the metal oxide barrier 335A may be about 1.1 to 3 times thicker than the second barrier layer 333A and the metal oxide barrier 335B may be about 1.1 to 3 times thicker than the second barrier layer 333B.

Figure 15A:
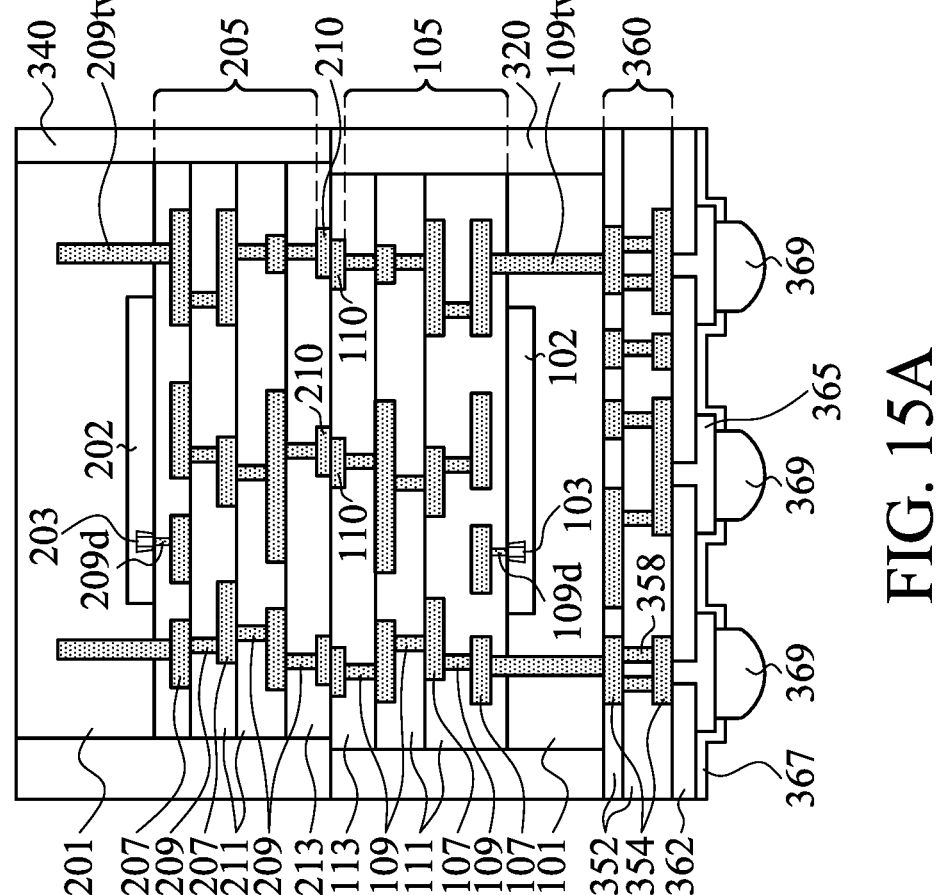
FIGS. 15A and 15B schematically illustrates a packaged device including the results of additional processing in accordance with some embodiments.
Figure 15B:
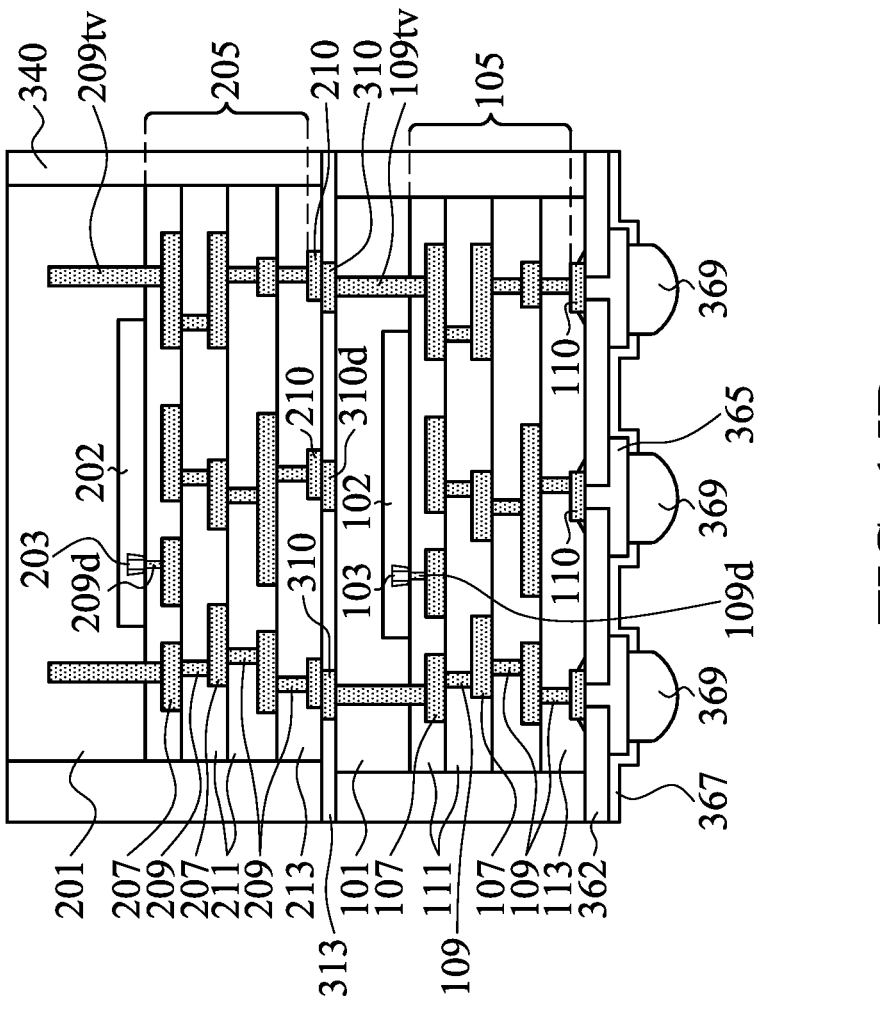

In FIGS. 15A and 15B, further processing steps may be performed after bonding the semiconductor device 200 to the semiconductor device 100. In FIG. 15A, for example, a second encapsulant 340 is deposited over and surrounding the semiconductor device 200. The second encapsulant 340 may then be planarized and leveled with upper surfaces of the semiconductor device 200. In some embodiments, through-die vias 209tv of the semiconductor device 200 may be exposed and then another bonding process may be performed with another semiconductor device like unto the semiconductor device 200. Since the semiconductor device 200 is face down, the additional bonding process may be similar to those illustrated in FIGS. 5B and 15B. If the semiconductor device 200 is a wafer, then the second encapsulant 340 may be omitted.

The structure may be removed from the carrier substrate 300. In some embodiments, release layer 302 may be exposed to UV light, thereby degrading an adhesive and allowing the carrier substrate 300 to come free. In some embodiments, carrier substrate 300 may be removed by grinding or etching, or the like.

In FIG. 15A, following the removal of carrier substrate 300, a carrier reverse process may be used, and the through-die vias 109tv may be exposed by a planarization process. An interconnect structure 360 including dielectric layers 352, metal lines 354, and vias 358 may be formed. In some embodiments, the interconnect structure 360 is a back-side redistribution layer (RDL) structure. The interconnect structure 360 may be formed using processes and materials similar to those discussed above with respect to the interconnect structure 205, with the dielectric layers 352 corresponding to the dielectric layers 111, the metal lines 354 corresponding to the metal lines 107, and the vias 358 corresponding to the vias 109.

In FIG. 15B, the bond pads 110 of the semiconductor device 100 may be exposed and an optional interconnect structure 360 (such as illustrated in FIG. 15A) may be formed, in some embodiments.

In FIGS. 15A and 15B, a passivation layer 362 may be deposited over the structure and openings may be formed therein to expose the underlying contacts, such as the metal lines 354 or bond pads 110. Connectors 369 can be formed in the openings. In some embodiments, the connectors 369 may be controlled collapse chip connection (C4) bumps, micro-bumps, solder balls, or the like. For example, in some embodiments, an under bump metallurgy (UBM) layer 365 can be formed in the openings prior to the formation of the connectors 369. A second passivation layer 367 can be deposited over the UBM layer 365 and additional openings formed therein to expose the UBM layer 365. Then the connectors 369 may be formed in the openings, and may be a solder bump, a copper micro-bump, a copper pillar, a C4 bump, or the like.

Embodiments advantageously provide a second diffusion barrier layer in a direct metal-to-metal bond that can provide diffusion protection for an overlay offset where a bond pad abuts a dielectric layer. A metal ion implantation may be performed on the bond pad(s) prior to a bonding process.

Then, during the bonding process, the metal ions diffuse to the outer surfaces of the bond pads at a rate faster than the material of the bond pads, thereby forming a second diffusion barrier. Where the metal ions diffuse to the interface of the bond pad and the dielectric layer of the adjoining device, the metal ions can form a metal oxide of the metal ions, such that a metal oxide barrier is formed for that portion of the second diffusion barrier. Accordingly, the longevity and durability of the dielectric layer can be improved and the TDDB improved.

In some embodiments, a method includes implanting first metal ions in a first conductive material of a first bond pad of a first semiconductor device or second metal ions in a second conductive material of a second bond pad of a second semiconductor device. The method also includes aligning the second bond pad to the first bond pad, the alignment having an overlay offset that causes an edge of the second bond pad to overlap a first dielectric layer that surrounds the first bond pad, where a first interface is formed between the second bond pad and the first dielectric layer. The method also includes performing a solder-free direct metal-to-metal bonding process to interdiffuse the first conductive material with the second conductive material, the bonding process causing diffusion of the first metal ions or the second metal ions to the first interface and forming a first metal oxide of the first metal ions or the second metal ions at the first interface.

In an embodiment, the method may include: implanting the first metal ions, where the bonding process further causes diffusion of the first metal ions to outer sidewalls of the first bond pad to form a second diffusion barrier at the outer sidewalls of the first bond pad, where the second diffusion barrier is surrounded by a first diffusion barrier. In an embodiment, the overlay offset further causes an edge of the first bond pad to overlap a second dielectric layer that surrounds the second bond pad, where a second interface is formed between the first bond pad and the second dielectric layer, where the bonding process further causes diffusion of the first metal ions or the second metal ions to the second interface and form a second metal oxide at the second interface. In an embodiment, the first metal oxide is thicker than the second metal oxide. In an embodiment, the first metal oxide and the second metal oxide have the same thickness. In an embodiment, a species of the first metal ions is different than a species of the second metal ions, where the first metal oxide is a different material than the second metal oxide. In an embodiment, the first metal oxide is thicker than the second metal oxide. In an embodiment, a species of the first metal ions or the second metal ions is one of tantalum, titanium, manganese, cobalt, iron, tin, or germanium. In an embodiment, the method may include diffusing the first metal ions or the second metal ions to a respective outer surface of the first bond pad or the second bond pad to form a barrier layer surrounding the first conductive material or the second conductive material, respectively.

In some embodiments, a device includes a first semiconductor device and a second semiconductor device. The first semiconductor device includes a first bond pad, a first barrier layer surrounding the first bond pad, and a first dielectric layer surrounding the first barrier layer, wherein the first bond pad includes a first metal ion barrier layer surrounding a conductive material. The second semiconductor device includes a second bond pad, a second barrier layer surrounding the second bond pad, and a second dielectric layer surrounding the second barrier layer, wherein the second bond pad is directly bonded with the first bond pad, wherein a first portion of the second bond pad extends beyond an edge of the first bond pad and overlaps the first dielectric layer, and wherein a first metal oxide is disposed on the first portion of the second bond pad.

In an embodiment, the device may include metal ions disposed in the conductive material of the first bond pad, the metal ions and the first metal ion barrier layer comprising a same metal element. In an embodiment, the second bond pad further comprises a second metal ion barrier layer surrounding a conductive material, and wherein the first metal oxide is an oxide of the second metal ion barrier layer. In an embodiment, a first portion of the first bond pad extends beyond an edge of the second bond pad and overlaps the second dielectric layer, wherein the first metal ion barrier layer comprises a second metal oxide on the first portion of the first bond pad. In an embodiment, thicknesses of the first metal oxide and the second metal oxide are different. In an embodiment, the first dielectric layer is directly bonded to the second dielectric layer.

In some embodiments, a device includes a first insulating bonding layer and a first bond pad in the first insulating bonding layer. The first bond pad comprises a first metal ion barrier layer, the first metal ion barrier layer comprising a first metal oxide at a surface of the first bond pad. The device further includes a second insulating bonding layer contacting the first insulating bonding layer and the first metal oxide. The device further includes a second bond pad in the second insulating bonding layer and contacting the first bond pad, the second bond pad comprises a second metal ion barrier layer, the second metal ion barrier layer comprising a second metal oxide at a surface of the second bond pad, the second metal oxide contacting the first insulating bonding layer.

In an embodiment, a material composition of the first metal oxide is the same as a material composition of the second metal oxide. In an embodiment, a material composition of the first metal oxide is different from a material composition of the second metal oxide. In an embodiment, a thickness of the first metal oxide is different from a thickness of the second metal oxide. In an embodiment, a thickness of the first metal oxide is the same as a thickness of the second metal oxide.

The above-described embodiments are intended to be exemplary and are not intended to be nor should they be construed to be limiting in terms of scope, exhaustion, or limitation. One skilled in the will recognize, for instance, that the above-described embodiments and configurations are not mutually exclusive (unless such mutual exclusivity is self-evident form the context of the description) and hence the various elements of the above-described embodiments can be combined together in various and additional ways beyond those ways specifically illustrated herein, which various and additional ways are within the contemplated scope of this disclosure and the claim appended hereto. For instance, one skilled in the art will recognize that the bonding via can be formed on the top semiconductor device 200 rather than the bottom semiconductor device 100 as illustrated. Likewise, either or both or neither of the semiconductor wafers could be subjected to back-side thinning, either before or after the bonding process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

implanting first metal ions in a first conductive material of a first bond pad of a first semiconductor device or second metal ions in a second conductive material of a second bond pad of a second semiconductor device;

aligning the second bond pad to the first bond pad, the alignment having an overlay offset that causes an edge of the second bond pad to overlap a first dielectric layer that surrounds the first bond pad, wherein a first interface is formed between the second bond pad and the first dielectric layer; and performing a solder-free direct metal-to-metal bonding process to interdiffuse the first conductive material with the second conductive material, the bonding process causing diffusion of the first metal ions or the second metal ions to the first interface and forming a first metal oxide of the first metal ions or the second metal ions at the first interface.

2. The method of claim 1, further comprising: implanting the first metal ions, wherein the bonding process further causes diffusion of the first metal ions to outer sidewalls of the first bond pad to form a second diffusion barrier at the outer sidewalls of the first bond pad, wherein the second diffusion barrier is surrounded by a first diffusion barrier.

3. The method of claim 1, wherein the overlay offset further causes an edge of the first bond pad to overlap a second dielectric layer that surrounds the second bond pad, wherein a second interface is formed between the first bond pad and the second dielectric layer, wherein the bonding process further causes diffusion of the first metal ions or the second metal ions to the second interface and form a second metal oxide at the second interface.

4. The method of claim 3, wherein the first metal oxide is thicker than the second metal oxide.

5. The method of claim 3, further comprising: implanting the first metal ions and the second metal ions, wherein the first metal oxide and the second metal oxide have the same thickness.

6. The method of claim 3, further comprising: implanting the first metal ions and the second metal ions, wherein a species of the first metal ions is different than a species of the second metal ions, wherein the first metal oxide is a different material than the second metal oxide.

7. The method of claim 3, further comprising: implanting the first metal ions to a first concentration and the second metal ions to a second concentration different than the first concentration, wherein the first metal oxide is thicker than the second metal oxide.

8. The method of claim 1, wherein a species of the first metal ions or the second metal ions is one of tantalum, titanium, manganese, cobalt, iron, tin, or germanium.

9. The method of claim 1, further comprising:

diffusing the first metal ions or the second metal ions to a respective outer surface of the first bond pad or the second bond pad to form a barrier layer surrounding the first conductive material or the second conductive material, respectively.

10. A device comprising:

a first semiconductor device comprising a first bond pad, a first barrier layer surrounding the first bond pad, and a first dielectric layer surrounding the first barrier layer, wherein the first bond pad includes a first metal ion barrier layer surrounding a conductive material; and a second semiconductor device comprising a second bond pad, a second barrier layer surrounding the second bond pad, and a second dielectric layer surrounding the second barrier layer, wherein the second bond pad is directly bonded with the first bond pad, wherein a first portion of the second bond pad extends beyond an edge of the first bond pad and overlaps the first dielectric layer, and wherein a first metal oxide is disposed on the first portion of the second bond pad.

11. The device of claim 10 further comprising metal ions disposed in the conductive material of the first bond pad, the metal ions and the first metal ion barrier layer comprising a same metal element.

12. The device of claim 10, wherein the second bond pad further comprises a second metal ion barrier layer surrounding a conductive material, and wherein the first metal oxide is an oxide of the second metal ion barrier layer.

13. The device of claim 10, wherein a first portion of the first bond pad extends beyond an edge of the second bond pad and overlaps the second dielectric layer, wherein the first metal ion barrier layer comprises a second metal oxide on the first portion of the first bond pad.

14. The device of claim 13, wherein thicknesses of the first metal oxide and the second metal oxide are different.

15. The device of claim 10, wherein the first dielectric layer is directly bonded to the second dielectric layer.

16. A device, comprising:

a first insulating bonding layer;

a first bond pad in the first insulating bonding layer, the first bond pad comprises a first metal ion barrier layer, the first metal ion barrier layer comprising a first metal oxide at a surface of the first bond pad;

a second insulating bonding layer contacting the first insulating bonding layer and the first metal oxide; and a second bond pad in the second insulating bonding layer and contacting the first bond pad, the second bond pad comprises a second metal ion barrier layer, the second metal ion barrier layer comprising a second metal oxide at a surface of the second bond pad, the second metal oxide contacting the first insulating bonding layer.

17. The device of claim 16, wherein a material composition of the first metal oxide is the same as a material composition of the second metal oxide.

18. The device of claim 16, wherein a material composition of the first metal oxide is different from a material composition of the second metal oxide.

19. The device of claim 16, wherein a thickness of the first metal oxide is different from a thickness of the second metal oxide.

20. The device of claim 16, wherein a thickness of the first metal oxide is the same as a thickness of the second metal oxide.

* * * * *